(12) United States Patent
Asayama

(10) Patent No.: US 11,239,625 B2
(45) Date of Patent: Feb. 1, 2022

(54) LASER APPARATUS INCLUDING GAS SUPPLY DEVICE AND EXHAUSTING DEVICE

(71) Applicant: Gigaphoton Inc., Tochigi (JP)

(72) Inventor: Takeshi Asayama, Oyama (JP)

(73) Assignee: Gigaphoton Inc., Tochigi (JP)

( * ) Notice: Subject to any disclaimer, the term of this patent is extended or adjusted under 35 U.S.C. 154(b) by 102 days.

(21) Appl. No.: 16/150,297

(22) Filed: Oct. 3, 2018

(65) Prior Publication Data

US 2019/0036290 A1  Jan. 31, 2019

Related U.S. Application Data

(63) Continuation of application No. PCT/JP2016/063716, filed on May 9, 2016.

(51) Int. Cl.
| | |
|---|---|
| *H01S 3/036* | (2006.01) |
| *H01S 3/225* | (2006.01) |
| *H01S 3/08* | (2006.01) |

(52) U.S. Cl.
CPC .............. *H01S 3/036* (2013.01); *H01S 3/225* (2013.01); *H01S 3/08009* (2013.01)

(58) Field of Classification Search
CPC ...... H01S 3/036; H01S 3/225; H01S 3/08009; G03F 7/70575; G03F 7/70025; G03F 7/2041
See application file for complete search history.

(56) References Cited

U.S. PATENT DOCUMENTS

| | | | | |
|---|---|---|---|---|
| 4,958,356 A | * | 9/1990 | Tanuma .................. | H01S 3/036 372/57 |
| 4,977,573 A | * | 12/1990 | Bittenson ................ | H01S 3/036 372/23 |

(Continued)

FOREIGN PATENT DOCUMENTS

| | | |
|---|---|---|
| CN | 101540467 A | 9/2009 |
| CN | 201584639 U | 9/2010 |

(Continued)

OTHER PUBLICATIONS

International Search Report issued in corresponding International Application No. PCT/JP2016/063716; dated Aug. 2, 2016.

(Continued)

*Primary Examiner* — M. A. Golub-Miller
(74) *Attorney, Agent, or Firm* — Studebaker & Brackett PC

(57) ABSTRACT

A laser apparatus includes a controller that selects one of a first gas control and a second gas control based on gas pressure measured by a pressure sensor. The first gas control causes at least one of first laser gas and second laser gas is supplied to a chamber such that the gas pressure in the chamber after the first gas control is higher than the gas pressure in the chamber before the first gas control. The second gas control causes at least the first laser gas is supplied to the chamber and causes a part of the laser gas in the chamber is exhausted such that a difference between the gas pressure in the chamber before the second gas control and the gas pressure in the chamber after the second gas control is smaller than a difference between the gas pressure in the chamber before the first gas control and the gas pressure in the chamber after the first gas control.

5 Claims, 19 Drawing Sheets

(56) References Cited

U.S. PATENT DOCUMENTS

| | | | |
|---|---|---|---|
| 5,124,998 A | | 6/1992 | Arrigoni et al. |
| 5,642,374 A | * | 6/1997 | Wakabayashi .......... H01S 3/134 372/57 |
| 5,710,787 A | * | 1/1998 | Amada ................... H01S 3/134 372/25 |
| 6,028,880 A | * | 2/2000 | Carlesi ................ G03F 7/70558 372/57 |
| 6,151,349 A | * | 11/2000 | Gong ...................... H01S 3/225 372/58 |
| 6,320,892 B1 | * | 11/2001 | Padmabandu ...... G03F 7/70358 372/59 |
| 6,490,307 B1 | * | 12/2002 | de Mos .................. H01S 3/225 372/59 |
| 6,496,527 B1 | * | 12/2002 | Terashima .............. H01S 3/225 372/60 |
| 6,714,577 B1 | * | 3/2004 | Stamm ................ G03F 7/70025 372/57 |
| 6,819,699 B1 | * | 11/2004 | Enami ..................... H01S 3/225 372/55 |
| 8,929,419 B1 | * | 1/2015 | Dean ....................... H01S 3/036 372/57 |
| 2006/0056478 A1 | * | 3/2006 | Albrecht ............. G03F 7/70575 372/55 |
| 2006/0239322 A1 | * | 10/2006 | Matsunaga ............. H01S 3/036 372/58 |
| 2013/0100980 A1 | * | 4/2013 | Abe ........................ H01S 3/225 372/57 |
| 2013/0170516 A1 | * | 7/2013 | Riggs ..................... H01S 3/036 372/58 |
| 2015/0188274 A1 | * | 7/2015 | Wakabayashi .......... H01S 3/134 372/25 |
| 2016/0013606 A1 | | 1/2016 | Matsuda et al. |
| 2016/0141823 A1 | | 5/2016 | Nishio |
| 2016/0248215 A1 | * | 8/2016 | Suzuki ................. B01D 53/685 |
| 2016/0254634 A1 | * | 9/2016 | Asayama ................ H01S 3/134 372/38.04 |
| 2018/0191122 A1 | * | 7/2018 | Suzuki .................... H01S 3/225 |
| 2018/0241170 A1 | * | 8/2018 | Suzuki .................... H01S 3/036 |
| 2018/0261973 A1 | * | 9/2018 | Fujimaki ................. H01S 3/038 |
| 2019/0173259 A1 | * | 6/2019 | Asayama ................ H01S 3/038 |

FOREIGN PATENT DOCUMENTS

| | | |
|---|---|---|
| CN | 102025101 A | 4/2011 |
| CN | 104037596 A | 9/2014 |
| JP | S61-001071 A | 1/1986 |
| JP | H02-142558 U | 12/1990 |
| JP | H04-102383 A | 4/1992 |
| JP | H08-335741 A | 12/1996 |
| JP | 2561510 Y2 | 1/1998 |
| JP | 2012-018979 A | 1/2012 |
| JP | 2016-021489 A | 2/2016 |
| WO | 01/28048 A2 | 4/2001 |
| WO | 2015/098985 A1 | 7/2015 |

OTHER PUBLICATIONS

International Preliminary Report on Patentability issued in corresponding International Application No. PCT/JP2016/063716; dated Nov. 13, 2018.

Zheng Yi-Jun et al.; "2 kHz Repetition-rate Compact TEA CO2 Laser"; Electro-Optic Technology Application; Feb. 2011; vol. 26, No. 1; China; with Partial English Translation.

Sakakibara Shinichi et al.; "Transition Characteristics to Arc Discharge of KrF Excimer-Laser Pumping Discharge"; Transactions of the Institute of Electrical Engineers of Japan; 1996, pp. 705-711; vol. 116-A, No. 8. with Partial English Translation.

An Office Action issued by the China National Intellectual Property Administration dated Jun. 12, 2020, which corresponds to Chinese Patent Application No. 201680084381.3 and is related to U.S. Appl. No. 16/150,297 with English language translation.

\* cited by examiner

LASER APPARATUS INCLUDING GAS SUPPLY DEVICE AND EXHAUSTING DEVICE

CROSS-REFERENCE TO RELATED APPLICATIONS

The present application is a continuation application of International Application No. PCT/JP2016/063716 filed on May 9, 2016. The content of the application is incorporated herein by reference in its entirety.

TECHNICAL FIELD

The present disclosure relates to a laser apparatus.

BACKGROUND ART

The recent miniaturization and increased levels of integration of semiconductor integrated circuits have led to a demand for increases in resolutions of semiconductor exposure apparatuses. A semiconductor exposure apparatus is hereinafter referred to simply as "exposure apparatus". Accordingly, exposure light sources to output light at shorter wavelengths have been under development. As the exposure light sources, gas laser apparatuses instead of conventional mercury lamps are typically used. The gas laser apparatuses for exposure include a KrF excimer laser apparatus that outputs an ultraviolet laser beam at a wavelength of 248 nm and an ArF excimer laser apparatus that outputs an ultraviolet laser beam at a wavelength of 193 nm.

As a current exposure technology, immersion exposure has been put to practical use. In the immersion exposure, a gap between a projection lens and a wafer in an exposure apparatus is filled with a fluid such as water to change refractive index in the gap such that an apparent wavelength of the light from the exposure light source is shortened. In a case where immersion exposure is performed using an ArF excimer laser apparatus as an exposure light source, a wafer is irradiated with ultraviolet light whose wavelength in water is equivalent to 134 nm. This technology is referred to as "ArF immersion exposure". The ArF immersion exposure is also referred to as "ArF immersion lithography".

Spectrum line widths of KrF and ArF excimer laser apparatuses in natural oscillation are as wide as approximately 350 pm to 400 pm. This causes a chromatic aberration of a laser beam (ultraviolet light) that is subjected to reduced projection onto a wafer by a projection lens in an exposure apparatus. The chromatic aberration thus causes a reduction in resolving power. Accordingly, spectrum line width of a laser beam that is outputted from a gas laser apparatus needs to be narrowed to such an extent that the chromatic aberration can be ignored. The spectrum line width is also referred to as "spectrum width". To narrow the spectrum width, a laser resonator of a gas laser apparatus is equipped with a line narrow optical system (line narrow module) having a line narrow element. The line narrow element may be an etalon, a grating, or the like. A laser apparatus whose spectrum width is narrowed in this way is referred to as "line narrowed laser apparatus".

Patent Document 1: International Publication No. WO2015/098985 A
Patent Document 2: US Patent Application Publication No. 2015/0188274 A
Patent Document 3: US Patent Application Publication No. 2013/0100980 A
Patent Document 4: International Publication No. WO01/028048 A
Patent Document 5: Japanese Patent Application Publication No. H04-102383 A
Patent Document 6: Japanese Patent Application Publication No. 2012-018979 A

SUMMARY

An aspect of the present disclosure relates to a laser apparatus including a chamber in which a pair of discharge electrodes is provided, a gas supply device configured to supply first laser gas including halogen gas and second laser gas having a halogen gas concentration lower than the first laser gas to the chamber, an exhausting device configured to exhaust laser gas in the chamber, a pressure sensor configured to measure gas pressure in the chamber, and a controller configured to select one of a first gas control and a second gas control based on the gas pressure measured by the pressure sensor. Here, the first gas control causes at least one of the first laser gas and the second laser gas to be supplied to the chamber such that the gas pressure in the chamber after the first gas control is higher than the gas pressure in the chamber before the first gas control, and the second gas control causes at least the first laser gas to be supplied to the chamber and causes a part of the laser gas in the chamber to be exhausted such that a difference between the gas pressure in the chamber before the second gas control and the gas pressure in the chamber after the second gas control is smaller than a difference between the gas pressure in the chamber before the first gas control and the gas pressure in the chamber after the first gas control.

Another aspect of the present disclosure relates to a laser apparatus including a chamber in which a pair of discharge electrodes is provided, a gas supply device configured to supply first laser gas including halogen gas and second laser gas having a halogen gas concentration lower than the first laser gas to the chamber, an exhausting device configured to exhaust laser gas in the chamber, and a controller configured to execute a first process to execute a gas control more than once to supply at least one of the first laser gas and the second laser gas to the chamber such that gas pressure in the chamber increases at a substantially constant rate per elapsed time, and a second process to execute a gas control more than once after the first process to supply at least the first laser gas to the chamber and exhaust a part of the laser gas in the chamber such that the gas pressure in the chamber is substantially kept at a first constant value regardless of the elapsed time.

BRIEF DESCRIPTION OF DRAWINGS

Exemplary embodiments of the present disclosure will be described below as mere examples with reference to the appended drawings.

DESCRIPTION OF EMBODIMENTS

Figure 1:
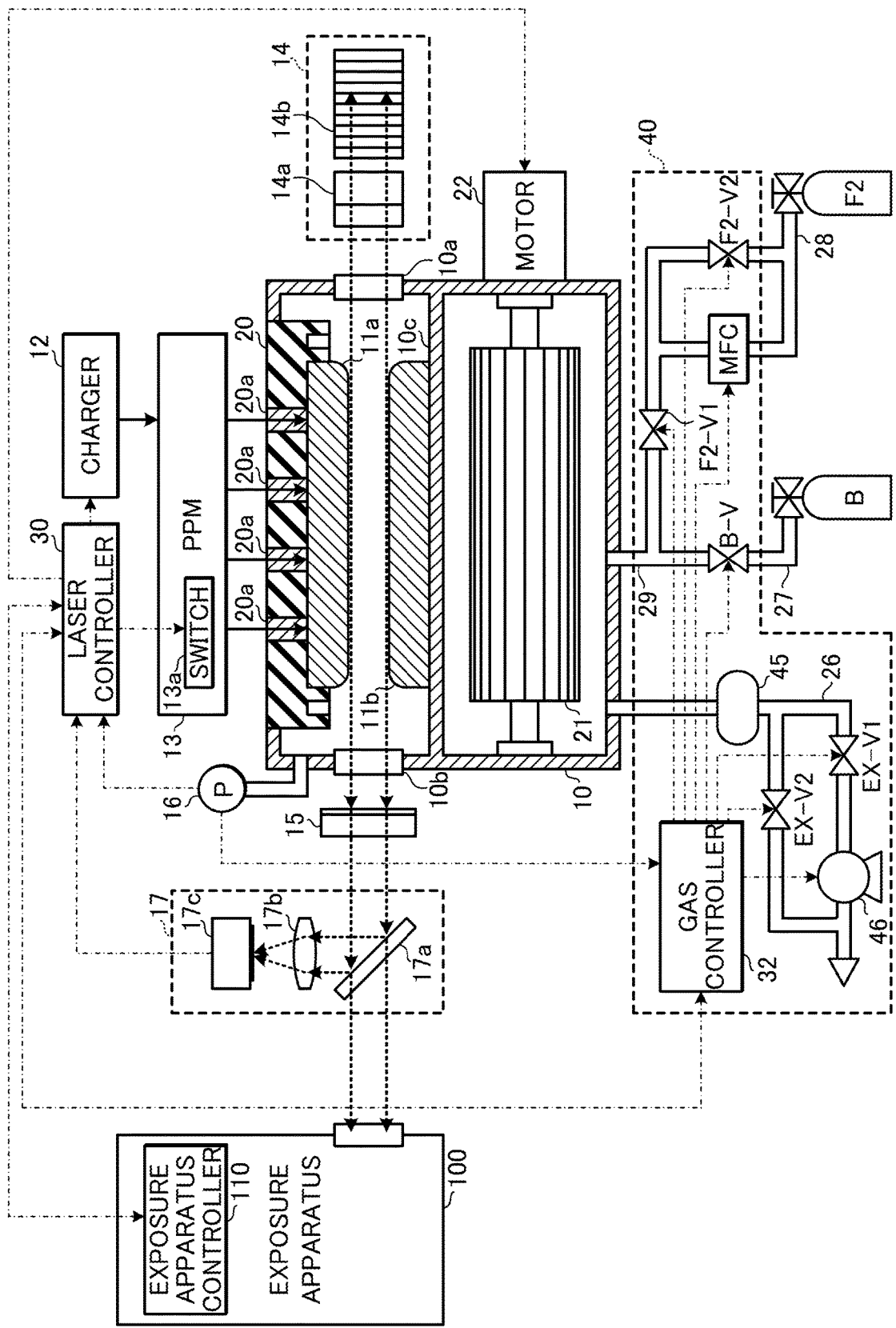
FIG. 1 schematically shows a configuration of a laser apparatus according to a comparative example.

<Content>
1. Summary
2. Laser Apparatus According to Comparative Example
  2.1 Configuration
    2.1.1 Laser Oscillation System
    2.1.2 Laser Gas Control System
  2.2 Operation
    2.2.1 Operation of Laser Oscillation System
    2.2.2 Energy Control
    2.2.3 Laser Gas Control
      2.2.3.1 Total Gas Replacement
      2.2.3.2 Gas Pressure Control Including Gas Supply or Gas Exhaust
      2.2.3.3 Halogen Gas Injection/Exhaust Control
      2.2.3.4 Partial Gas Replacement Control
3. Laser Apparatus That Suppresses Gas Exhaust Immediately After Total Gas Replacement
  3.1 Configuration
  3.2 Operation
    3.2.1 Laser Gas Control
      3.2.1.1 Gas Pressure Control without Gas Exhaust
      3.2.1.2 Halogen Gas Injection Control
  3.3 Effect
  3.4 Correction of Pressure
4. Laser Apparatus That Updates Predetermined Threshold Value by Adjusting Oscillation after Total Gas Replacement
  4.1 Configuration
  4.2 Operation
    4.2.1 Laser Gas Control
      4.2.1.1 Setting Initial Gas Pressure Pz
      4.2.1.2 Calculation of Predetermined Threshold Value Ppg
5. Laser Apparatus That Performs Gas Control Considering Elapsed Time
6. Configuration of Controller Embodiments of the present disclosure will be described in detail below with reference to the drawings. The embodiments described below indicate several examples of the present disclosure, and may not intend to limit the content of the present disclosure. Not all of the configurations and operations described in the embodiments are indispensable in the present disclosure. Identical reference symbols are assigned to identical constituent elements and redundant descriptions thereof are omitted.

1. SUMMARY

An embodiment of the present disclosure is related to a discharge-excited gas laser apparatus. The embodiment of the present disclosure is further related to an excimer laser apparatus. In the excimer laser apparatus, a laser gas including a rare gas and a halogen gas is sealed in a chamber. A pulsed high voltage is applied across a pair of discharge electrodes provided in the chamber. The laser gas is excited by an electric discharge generated between the discharge electrodes. The excited laser gas generates light. The light reciprocates in an optical resonator and is amplified, which causes a laser beam to be generated.

Generation of the laser beam in the excimer laser apparatus causes impurities to be generated in the laser gas and accumulated in the chamber. The impurities in the laser gas absorb the laser beam or worsen the condition of the electric discharge. Such impurities cause the performance of the laser to be reduced and cause the output of the laser beam having the desired pulse energy to be difficult or impossible. Thus, replacing a part of the laser gas in the chamber with new laser gas or supplying new halogen gas in the chamber has been proposed. Using the new laser gas moderates the reduction in the performance of the laser. However, it may cause the amount of consumption of the laser gas to be increased.

An embodiment of the present disclosure includes a proposal of a laser gas control that realizes not only moderating the reduction in the performance of the laser but also suppressing increase in the amount of consumption of the laser gas. Also, an embodiment of the present disclosure includes a proposal of a laser apparatus that executes such laser gas control.

2. LASER APPARATUS ACCORDING TO COMPARATIVE EXAMPLE 2.1 Configuration

FIG. 1 schematically shows a configuration of a laser apparatus according to a comparative example.

The laser apparatus is used with an exposure apparatus 100. A laser beam outputted from the laser apparatus enters the exposure apparatus 100. The exposure apparatus 100 includes an exposure apparatus controller 110. The exposure apparatus controller 110 is configured to control the exposure apparatus 100. The exposure apparatus controller 110 sends setting data of a target value of pulse energy and an oscillation trigger signal to a laser controller 30 included in the laser apparatus.

The laser apparatus shown in FIG. 1 includes a laser oscillation system, the laser controller 30, and a laser gas control system 40. The laser oscillation system includes a chamber 10, a charger 12, a pulse power module (PPM) 13, a line narrow module 14, an output coupling mirror 15, a pressure sensor 16, an energy monitor 17, a cross-flow fan 21, and a motor 22.

The laser controller 30 integrally controls the entire laser apparatus. The laser controller 30 receives measured data from the energy monitor 17.

2.1.1 Laser Oscillation System

The chamber 10 included in the laser oscillation system is provided in an optical path of a laser resonator configured by the line narrow module 14 and the output coupling mirror 15. The chamber 10 has two windows 10a and 10b. The chamber 10 stores a pair of discharge electrodes 11a and 11b. The chamber 10 also stores a laser gas.

The chamber 10 has an opening that is covered by an insulating member 20. The discharge electrode 11a is supported by the insulating member 20 and the discharge electrode 11b is supported by a partitioning plate 10c of the chamber 10. In the insulating member 20, conductive members 20a are molded. The conductive members 20a apply a high voltage supplied by the pulse power module 13 to the discharge electrode 11a.

The partitioning plate 10c does not completely separate the interior of the chamber 10. The partitioning plate 10c is provided such that unillustrated gaps through which the laser gas passes are formed in the front and back of the paper surface of FIG. 1.

The cross-flow fan 21 is provided in the chamber 10. A rotating shaft of the cross-flow fan 21 is connected to the motor 22 provided outside of the chamber 10. The motor 22 rotates the cross-flow fan 21 according to a control signal from the laser controller 30. Rotating the cross-flow fan 21 by the motor 22 causes the laser gas to be circulated in the chamber 10.

The charger 12 holds electric energy to be supplied to the pulse power module 13. The pulse power module 13 includes a switch 13a. The pulse power module 13 is configured to apply a pulsed voltage across the discharge electrodes 11a and 11b.

The line narrow module 14 includes a wavelength-selecting element such as a prism 14a or a grating 14b. Instead of the line narrow module 14, a high-reflective mirror may be used.

The output coupling mirror 15 is configured by a partially reflective mirror.

The pressure sensor 16 is configured to measure the pressure of the laser gas in the chamber 10. The pressure sensor 16 sends measured data on the pressure to a gas controller 32 included in the laser gas control system 40.

The energy monitor 17 includes a beam splitter 17a, a focusing lens 17b, and an optical sensor 17c. The beam splitter 17a is provided in an optical path of the laser beam outputted from the output coupling mirror 15. The beam splitter 17a is configured to transmit a part of the laser beam outputted from the output coupling mirror 15 to the exposure apparatus 100 at a high transmittance and reflect another part. The focusing lens 17b and the optical sensor 17c are provided in the optical path of the laser beam reflected by the beam splitter 17a. The focusing lens 17b is configured to concentrate the laser beam reflected by the beam splitter 17a to the optical sensor 17c. The optical sensor 17c is configured to send an electric signal according to the pulse energy of the laser beam concentrated by the focusing lens 17b as the measured data to the laser controller 30.

2.1.2 Laser Gas Control System

The laser gas control system 40 included in the laser apparatus includes a gas supply device, an exhausting device, and a gas controller 32. The gas controller 32 is configured to send and receive signals to and from the laser controller 30. The gas controller 32 receives the measured data outputted from the pressure sensor 16.

The laser gas control system 40 includes, as the gas supply device, pipes 27, 28, and 29, valves B-V, F2-V1, and F2-V2, and a mass-flow controller MFC.

The pipe 28 is connected to a halogen-containing gas supply source F2. The pipe 29 is connected to the chamber 10. Connecting the pipe 28 to the pipe 29 allows the halogen-containing gas supply source F2 to supply a halogen-containing gas to the chamber 10. The halogen-containing gas supply source F2 is a gas cylinder that stores a laser gas including fluorine. The halogen-containing gas is a laser gas in which fluorine gas, krypton gas, and neon gas are mixed. Another example of the halogen-containing gas may be a laser gas in which fluorine or chlorine gas, argon or xenon gas, and neon or helium gas are mixed.

The valve F2-V1 is provided in the pipe 28. The pipe 28 is divided into two branches at the middle thereof. The valve F2-V2 is provided in one of the branches and the mass-flow controller MFC is provided in the other. Supplying the halogen-containing gas from the halogen-containing gas supply source F2 via the pipe 29 to the chamber 10 is controlled by a combination of the valve F2-V1 and the valve F2-V2 or a combination of the valve F2-V1 and the mass-flow controller MFC. The valve F2-V1, the valve F2-V2, and the mass-flow controller MFC are controlled by the gas controller 32.

The pipe 27 is connected between the buffer gas supply source B and the pipe 29. Connecting the pipe 27 to the pipe 29 allows the buffer gas supply source B to supply buffer gas to the chamber 10. The buffer gas is a laser gas including krypton gas and neon gas. The buffer gas includes little halogen gas. Alternatively, the buffer gas may include halogen gas at a lower concentration than the halogen-containing gas supplied from the halogen-containing gas supply source F2. Another example of the buffer gas may be a laser gas including rare gases such as argon or xenon gas and neon or helium gas.

The valve B-V is provided in the pipe 27. Supplying the buffer gas from the buffer gas supply source B via the pipe 29 to the chamber 10 is controlled by opening and closing of the valve B-V. The opening and closing of the valve B-V are controlled by the gas controller 32.

The laser gas control system 40 includes, as the exhausting device, a pipe 26, a valve EX-V1, a valve EX-V2, a halogen gas trap 45, and an exhaust pump 46.

The pipe 26 is connected between the chamber 10 and an illustrated exhaust gas treating device or the like provided outside of the laser gas control system 40. The pipe 26 allows the laser gas exhausted from the chamber 10 to be emitted to the outside of the laser gas control system 40.

The halogen gas trap 45 is provided in the pipe 26. The halogen gas trap 45 is configured to catch halogen gas included in the laser gas exhausted from the chamber 10. A treating agent used to catch the halogen gas is, for example, activated carbon.

The pipe 26 is divided into two branches at the middle thereof. The valve EX-V1 and the exhaust pump 46 are provided in one of the branches and the valve EX-V2 is provided in the other. Emission of the gas from the chamber 10 via the halogen gas trap 45 is controlled by a combination of the valve EX-V1 and the exhaust pump 46 or by the valve EX-V2.

The valve EX-V1 and the exhaust pump 46 are controlled by the gas controller 32. The exhaust pump 46, when the valve EX-V1 is open, is capable of forcibly exhausting the laser gas in the chamber 10 until the pressure is reduced to a value lower than or equal to the atmospheric pressure.

The valve EX-V2 is controlled by the gas controller 32. Opening the valve EX-V2 causes a part of the laser gas in the chamber 10 to be exhausted according to the difference between the pressure in the chamber 10 and the atmospheric pressure.

2.2 Operation
2.2.1 Operation of Laser Oscillation System

The laser controller 30 receives, from the exposure apparatus controller 110, the setting data of the target value of pulse energy and the oscillation trigger signal. The laser controller 30 sends, based on the setting data of the target value of pulse energy received from the exposure apparatus controller 110, setting data of charging voltage of the charger 12. Further, the laser controller 30 sends, based on the oscillation trigger signal received from the exposure apparatus controller 110, a trigger signal to the switch 13a included in the pulse power module 13.

Upon receiving the trigger signal from the laser controller 30, the switch 13a in the pulse power module 13 turns ON. When the switch 13a turns ON, the pulse power module 13 generates a pulsed high voltage based on the electric energy charged to the charger 12 and applies the high voltage across the discharge electrodes 11a and 11b.

Applying the high voltage across the discharge electrodes 11a and 11b causes an electric discharge between the discharge electrodes 11a and 11b. The laser gas in the chamber 10 is excited by the energy of the electric discharge and shifts to a high energy level. Then, the excited laser gas shifts back to a low energy level to emit light having a wavelength according to the difference in the energy levels.

The light generated in the chamber 10 is emitted via the windows 10a and 10b to the outside of the chamber 10. The light emitted via the window 10a of the chamber 10 is expanded by the prism 14a and incident on the grating 14b. The light incident on the grating 14b from the prism 14a is reflected by a plurality of grooves of the grating 14b and diffracted in directions according to the wavelengths of the light. The grating 14b is in a Littrow arrangement such that the angle of incidence of the light incident on the grating 14b from the prism 14a coincides with an angle of diffraction of the diffracted light having the desired wavelength. This allows the light around the desired wavelength to be returned via the prism 14a to the chamber 10.

The output coupling mirror 15 transmits and outputs a part of the light emitted via the window 10b of the chamber 10 and reflects and returns another part to the chamber 10.

The light emitted from the chamber 10 thus reciprocates between the line narrow module 14 and the output coupling mirror 15. The light is amplified every time it passes through the electric discharge space between the discharge electrodes 11a and 11b. Also, the spectral width of the light is narrowed every time it is returned by the line narrow module 14. The light thus generated by the laser oscillation with the narrowed spectral width is outputted as a laser beam from the output coupling mirror 15.

The energy monitor 17 detects the pulse energy of the laser beam outputted from the output coupling mirror 15. The energy monitor 17 sends the data on the detected pulse energy to the laser controller 30.

The laser controller 30 performs a feedback control of the charging voltage to be set to the charger 12 based on the measured data on the pulse energy received from the energy monitor 17 and the setting data of the target value of pulse energy received from the exposure apparatus controller 110.

2.2.2 Energy Control

Figure 2:
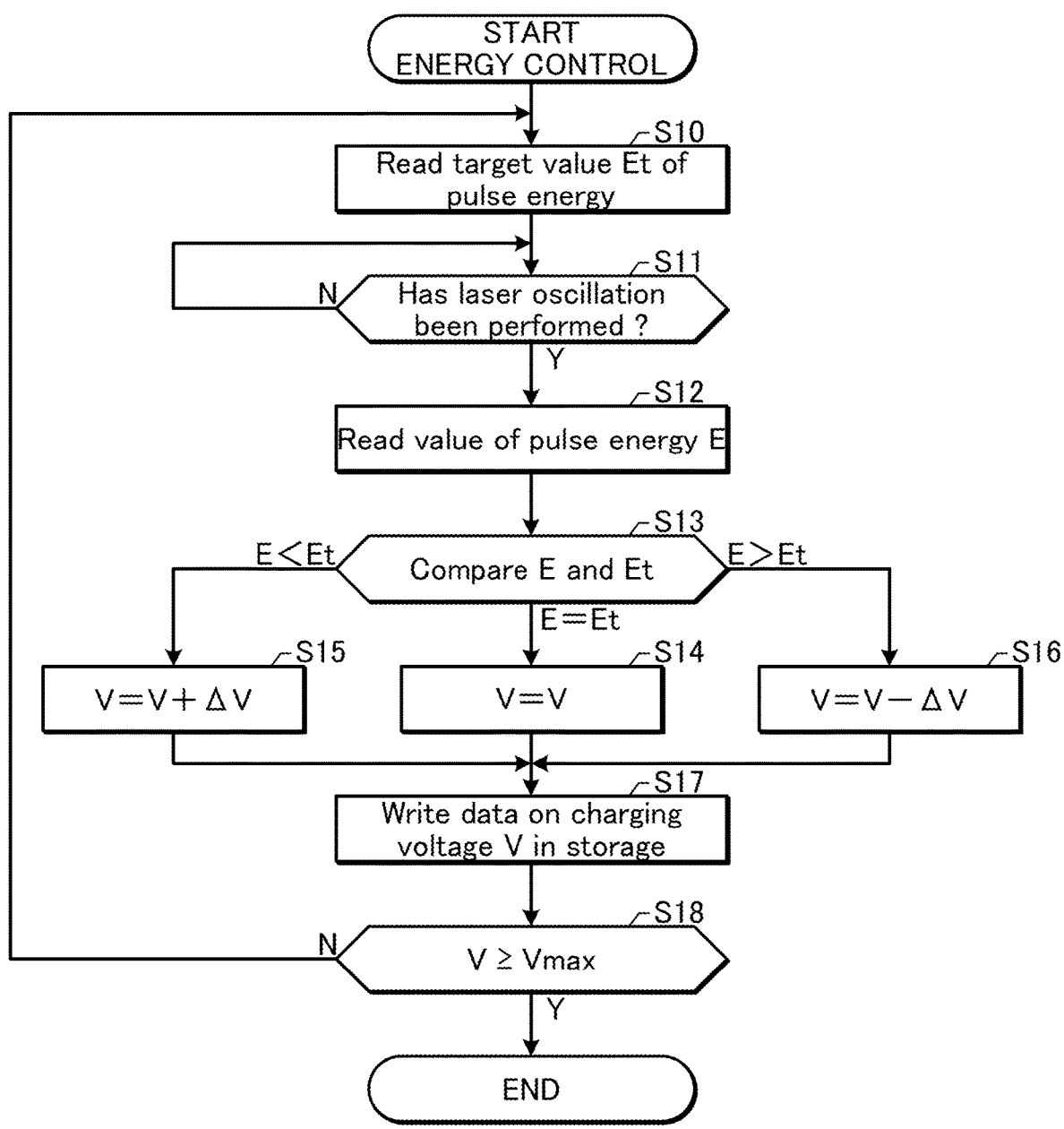
FIG. 2 is a flowchart showing an energy control performed by a laser controller 30 of the laser apparatus according to the comparative example.

FIG. 2 is a flowchart showing an energy control performed by the laser controller 30 of the laser apparatus according to the comparative example. The laser controller 30 controls the charging voltage of the charger 12 in the process described below such that the pulse energy of the output pulse laser beam approaches the target value of pulse energy.

First, the laser controller 30 reads a target value Et of pulse energy of the laser beam (S10). The target value Et is a value set by, for example, the exposure apparatus controller 110.

Next, the laser controller 30 determines whether or not the laser oscillation has been performed (S11). Whether or not the laser oscillation has been performed is determined based on whether or not the laser controller 30 has sent various signals for performing the laser oscillation to the charger 12 and the pulse power module 13. Alternatively, whether or not the laser oscillation has been performed may be determined based on whether or not the laser controller 30 has received the data on the pulse energy E from the energy monitor 17.

Next, the laser controller 30 reads the value of the pulse energy E of the laser beam (S12). The value of the pulse energy E to be read is one that has been received from the energy monitor 17.

Next, the laser controller 30 compares the value of the pulse energy E of the laser beam and the target value Et of pulse energy (513).

If the value of the pulse energy E is equal to the target value Et (E=Et), the laser controller 30 keeps the charging voltage V of the charger 12 to the present charging voltage V (S14: V=V).

If the value of the pulse energy E is lower than the target value Et (E<Et), the laser controller 30 increases the charging voltage V of the charger 12 to a value obtained by adding a predetermined amount of change $\Delta V$ to the present value of charging voltage V (S15: V=V+$\Delta V$). The pulse energy E thus increases and approaches the target value Et.

If the value of the pulse energy E is higher than the target value Et (E>Et), the laser controller 30 decreases the charging voltage V of the charger 12 to a value obtained by subtracting the predetermined amount of change $\Delta V$ from the present charging voltage V (S16: V=V−$\Delta V$). The pulse energy E thus decreases and approaches the target value Et.

As the laser apparatus repeats the electric discharge and impurities are accumulated in the laser gas, the pulse energy E tends to be reduced. Accordingly, if impurities are accumulated in the laser gas and the gas pressure or other conditions are not changed, the charging voltage V tends to be increased in the process of S15.

After the control of the charging voltage V shown in one of S14 to S16 ends, the laser controller 30 writes the data on the charging voltage V in the storage (317). The storage to be used is a memory 1002 described below. Alternatively, the laser controller 30 may send the data on the charging voltage V to the gas controller 32.

Next, the laser controller 30 determines whether or not the charging voltage V is higher than or equal to a maximum value Vmax (S18). If the charging voltage V is higher than or equal to the maximum value Vmax (V≥Vmax), the emission efficiency of the laser beam is not good and thus it is necessary to stop the laser oscillation to perform a total gas replacement or maintenance of the chamber. Accordingly, the process of this flowchart is ended. If the charging voltage V is lower than the maximum value Vmax (V<Vmax), the laser controller 30 returns to S10 described above and continues the control of the charging voltage V to stabilize the pulse energy E.

2.2.3 Laser Gas Control

Figure 3:
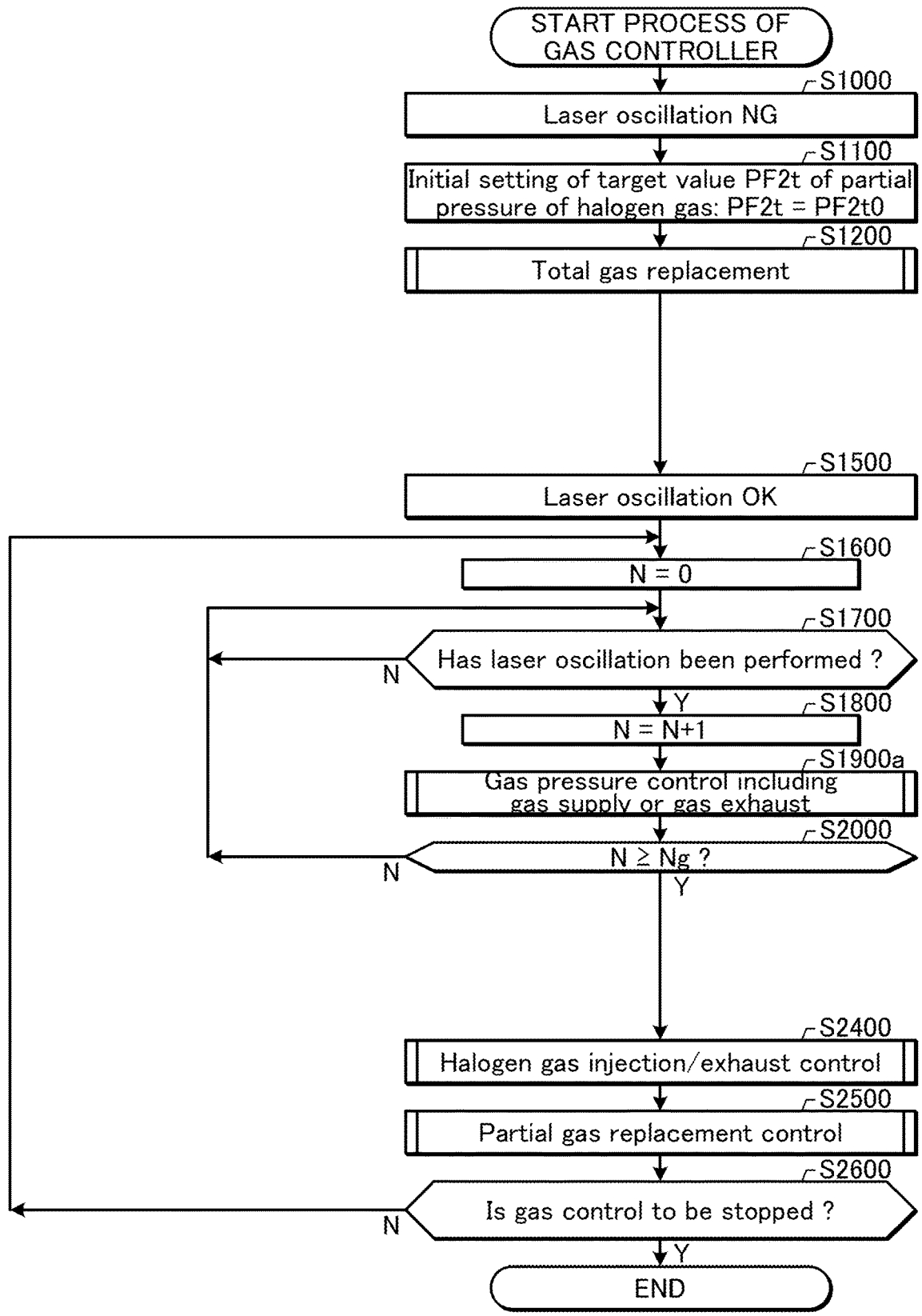
FIG. 3 is a flowchart showing a process of a laser gas control performed by a gas controller 32 of the laser apparatus according to the comparative example.

FIG. 3 is a flowchart showing a process of the laser gas control performed by the gas controller 32 of the excimer laser apparatus according to the comparative example. The gas controller 32 performs the process described below including a total gas replacement, a gas pressure control, a halogen gas injection/exhaust control, and a partial gas replacement control.

First, at S1000, the gas controller 32 sends a laser oscillation NG signal to the laser controller 30. The laser oscillation NG signal is a signal to show that the laser oscillation is prohibited.

Next, at S1100, the gas controller 32 sets a target value PF2$t$ of partial pressure of halogen gas to an initial value PF2$t$0. The initial value PF2$t$0 is selected such that the laser gas is excited by the electric discharge between the discharge electrodes 11$a$ and 11$b$ and the pulse laser beam is outputted from the chamber 10. The initial value PF2$t$0 is, for example, in a range from 0.13 kPa to 0.18 kPa.

Next, at S1200, the gas controller 32 controls the laser gas control system 40 to perform the total gas replacement. The total gas replacement is performed such that the partial pressure of halogen gas in the chamber 10 is adjusted to the initial value PF2$t$0 that has been set. Details of the total gas replacement will be described below with reference to FIG. 4.

Next, at S1500, the gas controller 32 outputs a laser oscillation OK signal to the laser controller 30. The laser oscillation OK signal is a signal to show that the gas condition for the laser oscillation is satisfied. The laser controller 30 determines, based on the laser oscillation OK signal, that the gas condition in the chamber 10 is satisfied and starts output of the pulse laser beam.

Next, at S1600, the gas controller 32 sets the value of a counter N to an initial value 0. The counter N is a counter to measure the number of pulses of the laser oscillation performed by the laser apparatus.

Next, at S1700, the gas controller 32 determines whether or not the laser oscillation has been performed. Whether or not the laser oscillation has been performed is determined, for example, based on whether or not the value of the pulse energy E has been received from the energy monitor 17. Alternatively, whether or not the laser oscillation has been performed is determined based on whether or not a signal for performing the laser oscillation such as the trigger signal is outputted from the laser controller 30. If the laser oscillation has not been performed (S1700: NO), the gas controller 32 waits until the laser oscillation is performed. If the laser oscillation has been performed (S1700: YES), the gas controller 32 proceeds to S1800.

At S1800, the gas controller 32 adds 1 to the value of the counter N to update it. Every time the laser apparatus outputs one pulse of the pulse laser beam, the process of S1800 is performed once.

Next, at S1900$a$, the gas controller 32 controls the laser gas control system 40 to perform the gas pressure control including gas supply or gas exhaust. Details of the gas pressure control including the gas supply or gas exhaust will be described below with reference to FIG. 5.

Next, at S2000, the gas controller 32 determines whether or not the value of the counter N is larger than or equal to a predetermined value Ng. If the value of the counter N is smaller than the predetermined value Ng, the gas controller 32 returns to S1700 described above. If the value of the counter N is larger than or equal to the predetermined value Ng, the gas controller 32 proceeds to S2400.

At S2400, the gas controller 32 controls the laser gas control system 40 to perform the halogen gas injection/exhaust control. Details of the halogen gas injection/exhaust control will be described below with reference to FIG. 6.

Next, at S2500, the gas controller 32 controls the laser gas control system 40 to perform the partial gas replacement control. Details of the partial gas replacement control will be described below with reference to FIG. 7.

Here, at every time the number of pulses reaches the predetermined value Ng, the process of S2400 and the process of S2500 are performed. However, the present disclosure is not limited to this. The process of either one of S2400 and S2500 may be selected.

Next, at S2600, the gas controller 32 determines whether or not the gas control is to be stopped. For example, if it is necessary to perform the total gas replacement, it is determined that the gas control is to be stopped (S2600: YES), then the process of this flowchart is once ended and executed from the beginning. If it is determined that the gas control is not to be stopped (S2600: NO), the gas controller 32 returns to S1600 described above.

2.2.3.1 Total Gas Replacement

Figure 4:
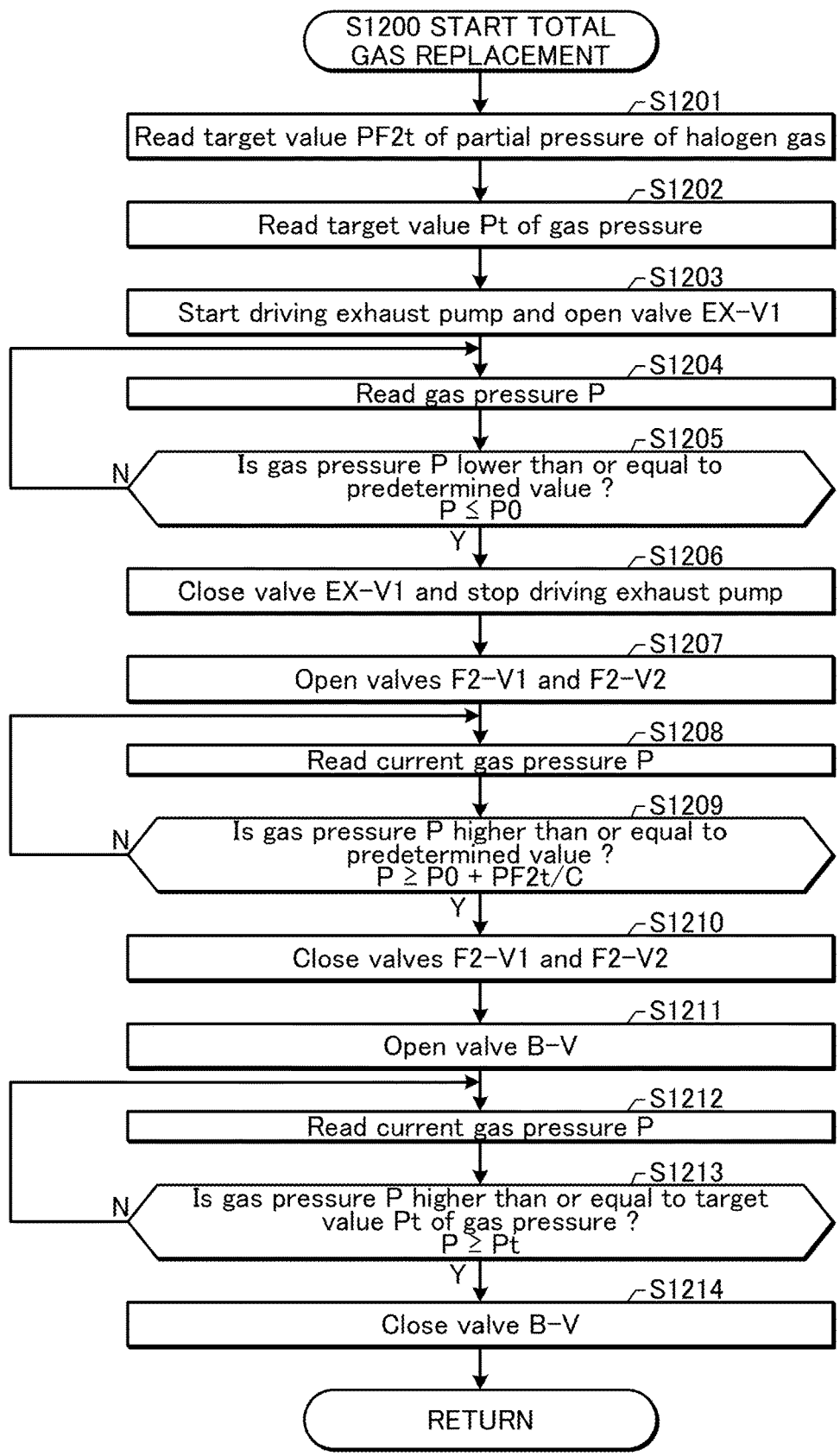
FIG. 4 is a flowchart showing details of a process of a total gas replacement shown in FIG. 3.

FIG. 4 is a flowchart showing details of the process of the total gas replacement shown in FIG. 3. The process shown in FIG. 4 is performed by the gas controller 32 as a subroutine of S1200 shown in FIG. 3.

First, at S1201, the gas controller 32 reads the target value PF2$t$ of partial pressure of halogen gas from the storage device. The target value PF2$t$ to be read is one that has been set at S1100 shown in FIG. 3.

Next, at S1202, the gas controller 32 reads a target value Pt of gas pressure from the storage device. The target value Pt is a value with which the laser gas is excited by the electric discharge between the discharge electrodes 11$a$ and 11$b$ and the pulse laser beam is outputted from the chamber 10.

Next, at S1203, the gas controller 32 starts driving the exhaust pump 46 and opens the valve EX-V1. Exhausting the laser gas in the chamber 10 is thus started. Here, the exhaust pump 46 forcibly exhausts the gas until the pressure is reduced to a value lower than or equal to the atmospheric pressure. The valve EX-V2 is kept closed.

Next, at S1204, the gas controller 32 reads the gas pressure P in the chamber 10 measured by the pressure sensor 16.

Next, at S1205, the gas controller 32 determines whether or not the gas pressure P is lower than or equal to a predetermined value P0. The predetermined value P0 is set in a range from 10 hPa to 50 hPa. If the gas pressure P is higher than the predetermined value P0 (S1205: NO), the gas controller 32 returns to S1204 described above. If the gas pressure P is lower than or equal to the predetermined value P0 (S1205: YES), the gas controller 32 proceeds to S1206.

At S1206, the gas controller 32 closes the valve EX-V1 and stops driving the exhaust pump 46.

Next, at S1207, the gas controller 32 opens the valves F2-V1 and F2-V2. This allows injection of the halogen-containing gas into the chamber 10 to be started. Here, the mass-flow controller MFC is not driven.

Next, at S1208, the gas controller 32 reads the gas pressure P in the chamber 10 measured by the pressure sensor 16.

Next, at S1209, the gas controller 32 determines whether or not the gas pressure P is higher than or equal to a predetermined value P0+PF2$t$/C. PF2$t$ is the target value of partial pressure of halogen gas described above. C is a halogen gas concentration in the halogen-containing gas at a volume ratio. By injecting the halogen-containing gas into the chamber 10 until the gas pressure P reaches the predetermined value P0+PF2$t$/C, the partial pressure of halogen gas in the chamber 10 approaches the target value of partial pressure of halogen gas.

If the gas pressure P is lower than the predetermined value P0+PF2$t$/C (S1209: NO), the gas controller 32 returns to S1208 described above. If the gas pressure P is higher than or equal to the predetermined value P0+PF2$t$/C (S1209: YES), the gas controller 32 proceeds to S1210.

At S1210, the gas controller 32 closes the valves F2-V1 and F2-V2.

Next, at S1211, the gas controller 32 opens the valve B-V. This allows injection of the buffer gas into the chamber 10 to be started.

Next, at S1212, the gas controller 32 reads the gas pressure P in the chamber 10 measured by the pressure sensor 16.

Next, at S1213, the gas controller 32 determines whether or not the gas pressure P is higher than or equal to the target value Pt of gas pressure. If the gas pressure P is lower than the target value Pt (S1213: NO), the gas controller 32 returns to S1212 described above. If the gas pressure P is higher than or equal to the target value Pt (S1213: YES), the gas controller 32 proceeds to S1214.

At S1214, the gas controller 32 closes the valve B-V.

After S1214, the gas controller 32 ends the process of this flowchart and returns to the process shown in FIG. 3.

2.2.3.2 Gas Pressure Control Including Gas Supply or Gas Exhaust

Figure 5:
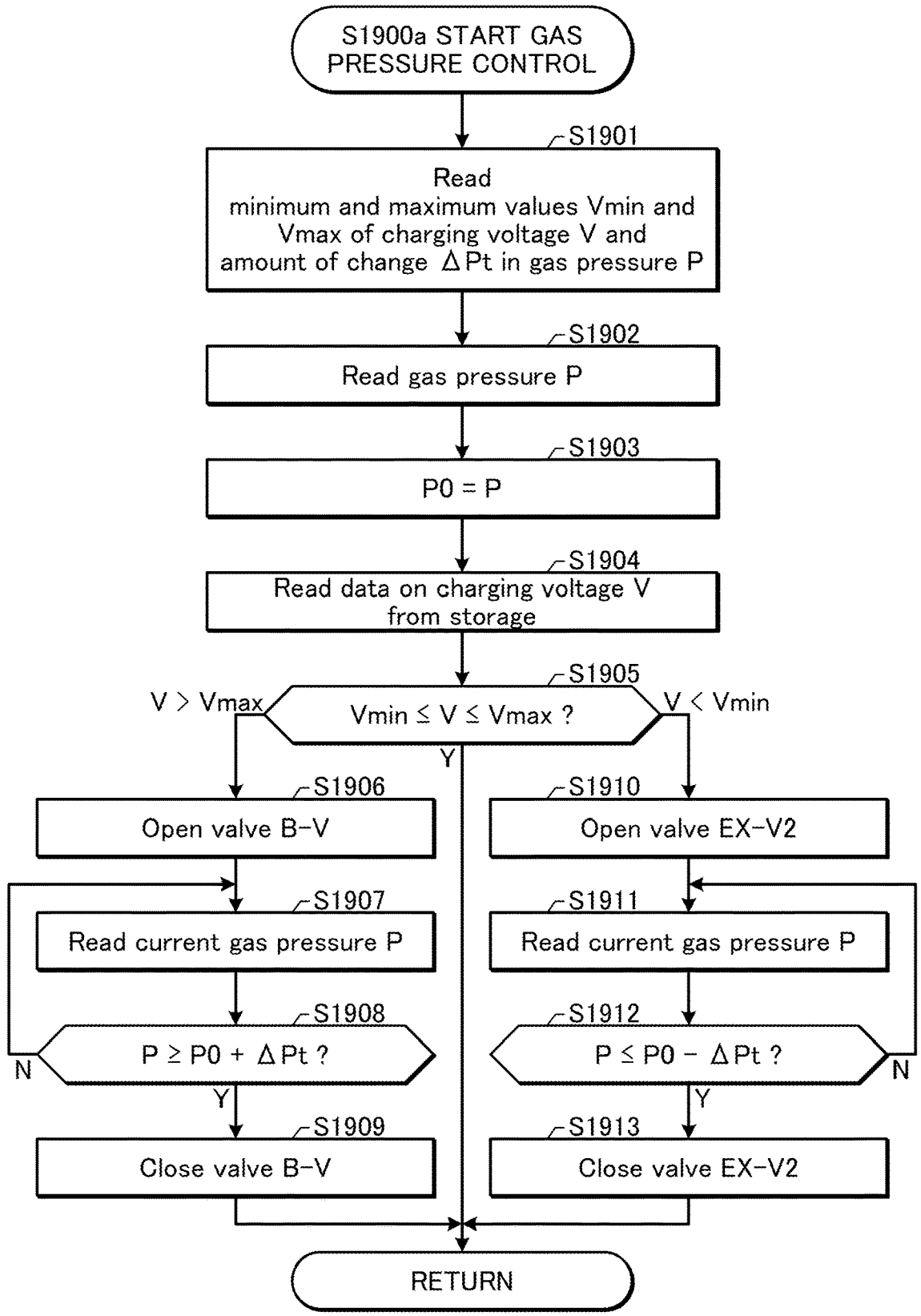
FIG. 5 is a flowchart showing details of a process of a gas pressure control shown in FIG. 3.

FIG. 5 is a flowchart showing details of the process of the gas pressure control shown in FIG. 3. The process shown in FIG. 5 is performed by the gas controller 32 as a subroutine of S1900$a$ shown in FIG. 3. The process of the total gas replacement described with reference to FIG. 4 is performed during a suspension of the laser oscillation. In contrast, the gas pressure control described below is performed in the period of performing laser oscillation (see S1500 in FIG. 3). The gas controller 32 controls the gas pressure in the chamber 10 based on the charging voltage V that has been set in the energy control shown in FIG. 2.

First, at S1901, the gas controller 32 reads parameters for the gas pressure control from the storage device. The parameters for the gas pressure control include minimum and maximum values Vmin and Vmax of the charging voltage V and an amount of change $\Delta$Pt in the gas pressure P.

Next, at S1902, the gas controller 32 reads the gas pressure P in the chamber 10 measured by the pressure sensor 16.

Next, at S1903, the gas controller 32 stores the present gas pressure P as an initial value P0 of the gas pressure in the storage device.

Next, at S1904, the gas controller 32 reads from the storage or receives from the laser controller 30 the value of the charging voltage V. The value of the charging voltage V is a value that has been set such that the pulse energy E approaches the target value Et of pulse energy in the process described with reference to FIG. 2.

Next, at S1905, the gas controller 32 determines whether or not the read or received charging voltage V is higher than or equal to the minimum value Vmin and lower than or equal to the maximum value Vmax. If the charging voltage V is higher than or equal to the minimum value Vmin and lower than or equal to the maximum value Vmax, the gas controller 32 ends the process of this flowchart and returns to the process shown in FIG. 3.

At S1905, if the charging voltage V is higher than the maximum value Vmax, the gas controller 32 opens the valve B-V at S1906. Supplying the buffer gas to the chamber 10 is thus started and the gas pressure P begins to increase. Here, the buffer gas substantially not including halogen gas is supplied to the chamber 10. Accordingly, the partial pressure of halogen gas in the chamber 10 does not substantially change.

Next, at S1907, the gas controller 32 reads the gas pressure P in the chamber 10 measured by the pressure sensor 16.

Next, at S1908, the gas controller 32 determines whether or not the gas pressure P is higher than or equal to a predetermined value P0+$\Delta$Pt. The predetermined value P0+$\Delta$Pt is a value obtained by adding the amount of change $\Delta$Pt in the gas pressure to the initial value P0 stored at S1903. If the gas pressure P is lower than the predetermined value P0+$\Delta$Pt (S1908: NO), the gas controller 32 returns to S1907 described above. If the gas pressure P is higher than or equal to the predetermined value P0+$\Delta$Pt (S1908: YES), the gas controller 32 proceeds to S1909.

At S1909, the gas controller 32 closes the valve B-V. Supplying the buffer gas to the chamber 10 is thus ended. The gas controller 32 then ends the process of this flowchart and returns to the process shown in FIG. 3.

As described above, as the laser apparatus repeats the electric discharge, impurities are accumulated in the laser gas and the charging voltage V tends to increase by the process of S15. Accordingly, when impurities are accumulated in the laser gas, the gas pressure P tends to increase by the process from S1905 to S1909.

At S1905, if the charging voltage V is lower than the minimum value Vmin, the gas controller 32 opens the valve EX-V2 at S1910. Exhausting the laser gas in the chamber 10 is thus started and the gas pressure begins to decrease. This occurs in the period of performing laser oscillation. Accordingly, the exhaust of the laser gas is not to bring the pressure to a value lower than or equal to the atmospheric pressure. Thus, the exhaust pump 46 is not driven and the valve EX-V1 is kept closed.

Next, at S1911, the gas controller 32 reads the gas pressure P in the chamber 10 measured by the pressure sensor 16.

Next, at S1912, the gas controller 32 determines whether or not the gas pressure P is lower than or equal to a predetermined value P0−$\Delta$Pt. The predetermined value P0−$\Delta$Pt is a value obtained by subtracting the amount of change $\Delta$Pt of the gas pressure from the initial value P0 stored at S1903. If the gas pressure P is higher than the predetermined value P0−$\Delta$Pt (S1912: NO), the gas controller 32 returns to S1911 described above. If the gas pressure P is lower than or equal to the predetermined value P0−ΔPt (S1912: YES), the gas controller 32 proceeds to S1913.

At S1913, the gas controller 32 closes the valve EX-V2. Exhausting the laser gas in the chamber 10 is thus ended. The gas controller 32 then ends the process of this flowchart and returns to the process shown in FIG. 3.

2.2.3.3 Halogen Gas Injection/Exhaust Control

Figure 6:
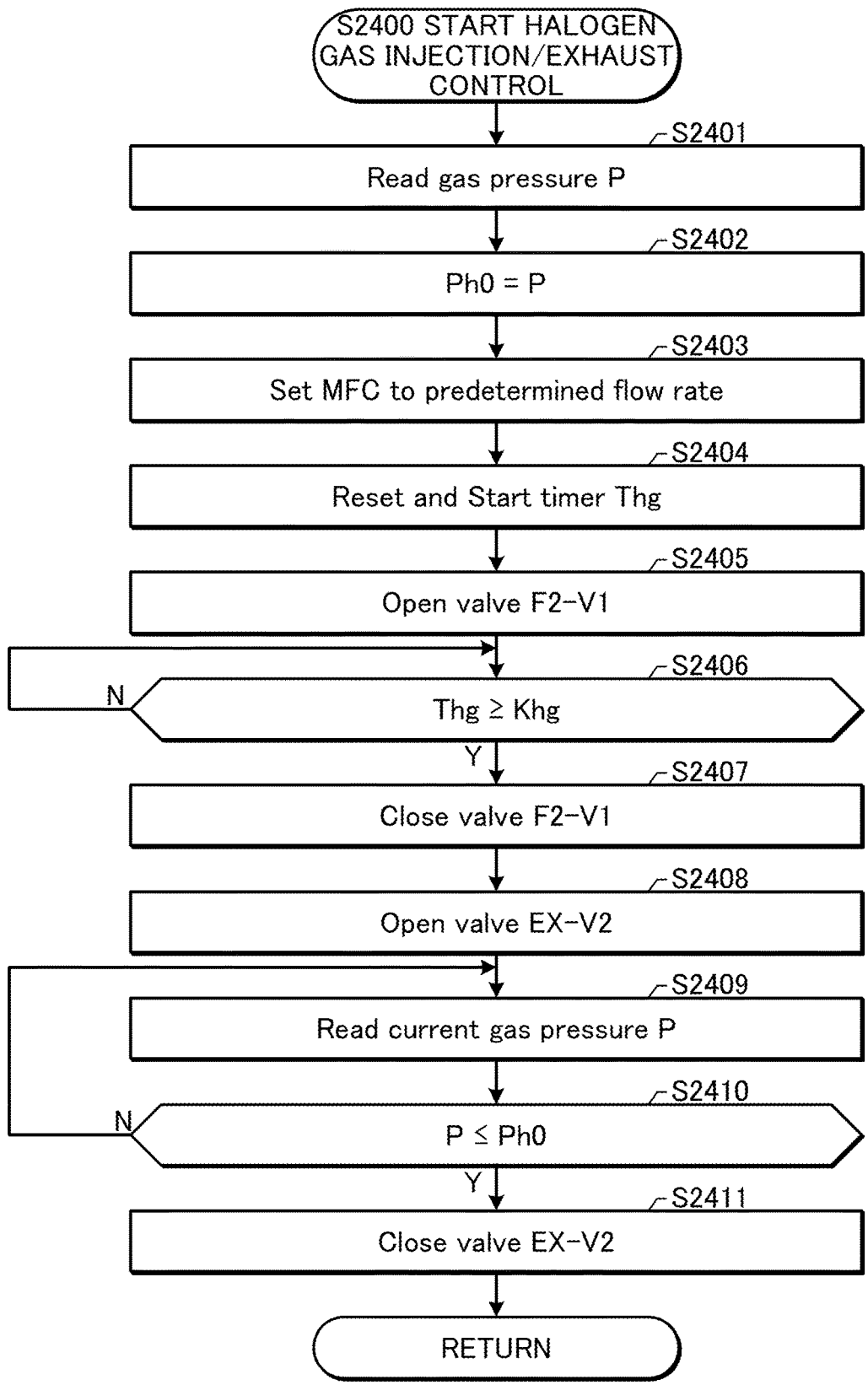
FIG. 6 is a flowchart showing details of a process of a halogen gas injection/exhaust control shown in FIG. 3.

FIG. 6 is a flowchart showing details of a process of the halogen gas injection/exhaust control shown in FIG. 3. The process shown in FIG. 6 is performed by the gas controller 32 as a subroutine of S2400 shown in FIG. 3. The process of the total gas replacement described above with reference to FIG. 4 is executed during the suspension of the laser oscillation. In contrast, the halogen gas injection/exhaust control is performed described below is executed in the period of performing laser oscillation.

First, at S2401, the gas controller 32 reads the gas pressure P in the chamber 10 detected by the pressure sensor 16.

Next, at S2402, the gas controller 32 stores the present gas pressure P in the storage device as an initial value Ph0 of the gas pressure.

Next, at S2403, the gas controller 32 sets the flow rate of the mass-flow controller MFC to a predetermined flow rate.

Next, at S2404, the gas controller 32 resets and starts a timer Thg.

Next, at S2405, the gas controller 32 opens the valve F2-V1. Injection of the halogen-containing gas into the chamber 10 at a flow rate set by the mass-flow controller MFC is thus started. According to the flow rate of the mass-flow controller MFC and the time measured by the timer Thg, the injection amount of the halogen-containing gas into the chamber 10 is precisely controlled. Here, the valve F2-V2 is kept closed.

Next, at S2406, the gas controller 32 determines whether or not the time measured by the timer Thg has reached a predetermined value Khg. If the time measured by the timer Thg has not reached the predetermined value Khg (S2406: NO), the gas controller 32 waits until it reaches the predetermined value Khg. If the time measured by the timer Thg has reached the predetermined value Khg (S2406: YES), the gas controller 32 proceeds to S2407.

At S2407, the gas controller 32 closes the valve F2-V1. Injection of the halogen-containing gas into the chamber 10 is thus stopped.

Next, at S2408, the gas controller 32 opens the valve EX-V2. Exhausting the laser gas in the chamber 10 is thus started. Here, the exhaust pump 46 is not driven and the valve EX-V1 is kept closed.

Next, at S2409, the gas controller 32 reads the gas pressure P in the chamber 10 detected by the pressure sensor 16.

Next, at S2410, the gas controller 32 determines whether or not the gas pressure P is lower than or equal to the initial value Ph0 stored at S2402. If the gas pressure P is higher than the initial value Ph0 (S2410: NO), the gas controller 32 returns to S2409 described above. If the gas pressure P is lower than or equal to the initial value Ph0 (S2410: YES), the gas controller 32 proceeds to S2411.

At S2411, the gas controller 32 closes the valve EX-V2. Exhausting the laser gas in the chamber 10 is thus stopped.

With the process from S2401 to S2407 described above, the partial pressure of halogen gas in the chamber 10 increases. With the process from S2408 to S2411 described above, the gas pressure P in the chamber 10 returns to the initial value Ph0. Accordingly, the partial pressure of halogen gas in the chamber 10 after the halogen gas injection/exhaust control is higher than that before the halogen gas injection/exhaust control. However, the gas pressure P in the chamber 10 after the halogen gas injection/exhaustion control is substantially the same as that before the halogen gas injection/exhaust control.

The gas controller 32 then ends the process of this flowchart and returns to the process shown in FIG. 3.

2.2.3.4 Partial Gas Replacement Control

Figure 7:
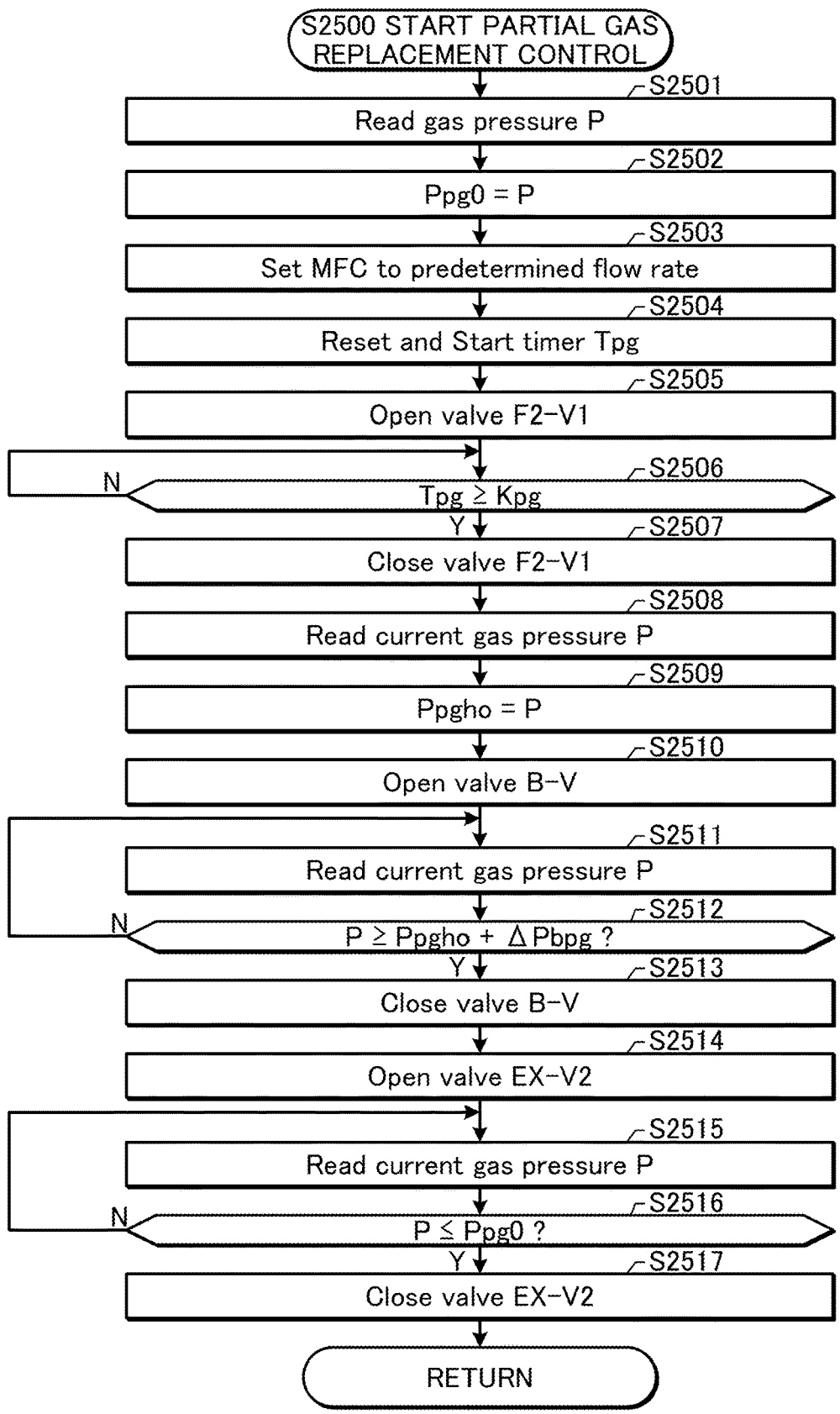
FIG. 7 is a flowchart showing details of a process of a partial gas replacement control shown in FIG. 3.

FIG. 7 is a flowchart showing details of the process of the partial gas replacement control shown in FIG. 3. The process shown in FIG. 7 is performed as a subroutine of S2500 shown in FIG. 3 by the gas controller 32. The process of the total gas replacement described with reference to FIG. 4 is performed during the suspension of laser oscillation. In contrast, the partial gas replacement control described below is performed in the period of performing laser oscillation.

First, the process from S2501 to S2507 is substantially the same as the process from S2401 to S2407 described with reference to FIG. 6, except that different parameters are used. In the process from S2501 to S2507, the halogen-containing gas is injected into the chamber 10.

Next, in the following process from S2508 to S2513, the buffer gas is injected into the chamber 10.

First, at S2508, the gas controller 32 reads the gas pressure P of the chamber 10 detected by the pressure sensor 16.

Next, at S2509, the gas controller 32 stores the present gas pressure P as an initial value Ppgho of the gas pressure in the storage device.

Next, at S2510, the gas controller 32 opens the valve B-V. Supplying the buffer gas to the chamber 10 is thus started.

Next, at S2511, the gas controller 32 reads the gas pressure P in the chamber 10 detected by the pressure sensor 16.

Next, at S2512, the gas controller 32 determines whether or not the gas pressure P is higher than or equal to a predetermined value Ppgho+ΔPpbg. The predetermined value Ppgho+ΔPpbg is a value obtained by adding an injection amount ΔPpbg of the buffer gas, which is converted to pressure, to the initial value Ppgho stored at S2509. If the gas pressure P is lower than the predetermined value Ppgho+ΔPpbg (S2512: NO), the gas controller 32 returns to S2511 described above. If the gas pressure P is higher than or equal to the predetermined value Ppgho+ΔPpbg (S2512: YES), the gas controller 32 proceeds to S2513.

At S2513, the gas controller 32 closes the valve B-V. Injection of the buffer gas into the chamber 10 is thus ended.

Next, the process from S2514 to S2517 is substantially the same as the process from S2408 to S2411 described with reference to FIG. 6. However, in the process from S2514 to S2517, the gas pressure P returns to the initial value Ppg0 stored at S2502. Accordingly, the gas pressures P in the chamber 10 before and after the partial gas replacement control are substantially the same with each other.

A ratio of the injection amount of the halogen-containing gas in the process from S2501 to S2507 to the injection amount of the buffer gas in the process from S2508 to S2513 is set to a value such that the halogen gas concentration in the chamber 10 does not change. Accordingly, the partial pressures of halogen gas in the chamber 10 before and after the partial gas replacement control are substantially the same with each other.

The gas controller 32 then ends the process of this flowchart and returns to the process shown in FIG. 3.

3. LASER APPARATUS THAT SUPPRESSES GAS EXHAUST IMMEDIATELY AFTER TOTAL GAS REPLACEMENT

3.1 Configuration

Figure 8:
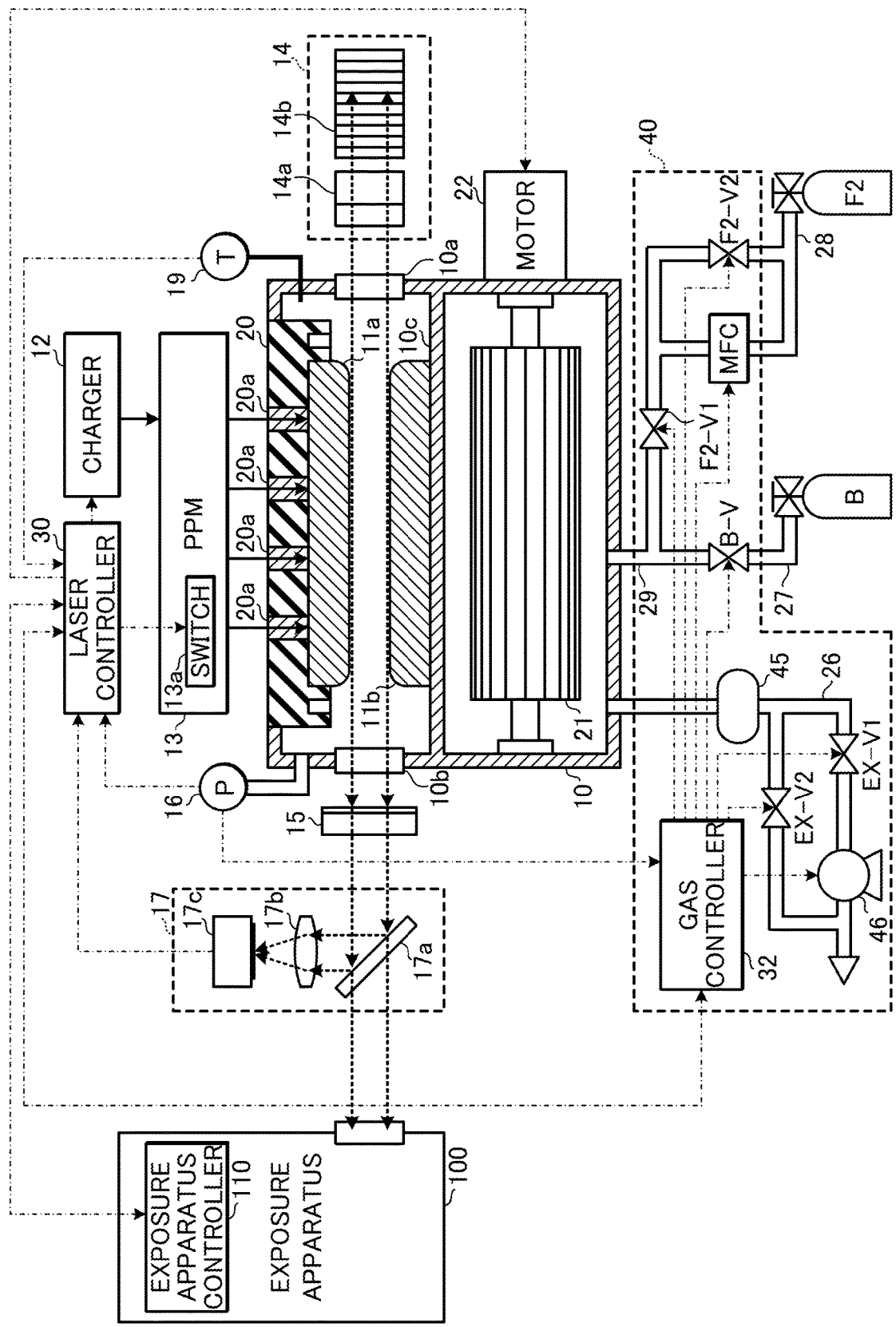
FIG. 8 schematically shows a configuration of a laser apparatus according to a first embodiment of the present disclosure.

FIG. 8 schematically shows a configuration of a laser apparatus according to a first embodiment of the present disclosure. In the first embodiment, the laser apparatus includes a temperature sensor 19.

The temperature sensor 19 is configured to detect the temperature of the laser gas in the chamber 10. The temperature sensor 19 outputs the detected temperature of the laser gas to the laser controller 30.

In other aspects, the configuration of the first embodiment is substantially the same as that of the comparative example described above with reference to FIG. 1.

3.2 Operation

In the laser apparatus according to the first embodiment, the process of the energy control executed by the laser controller 30 is substantially the same as that in the comparative example described with reference to FIG. 2.

3.2.1 Laser Gas Control

Figure 9:
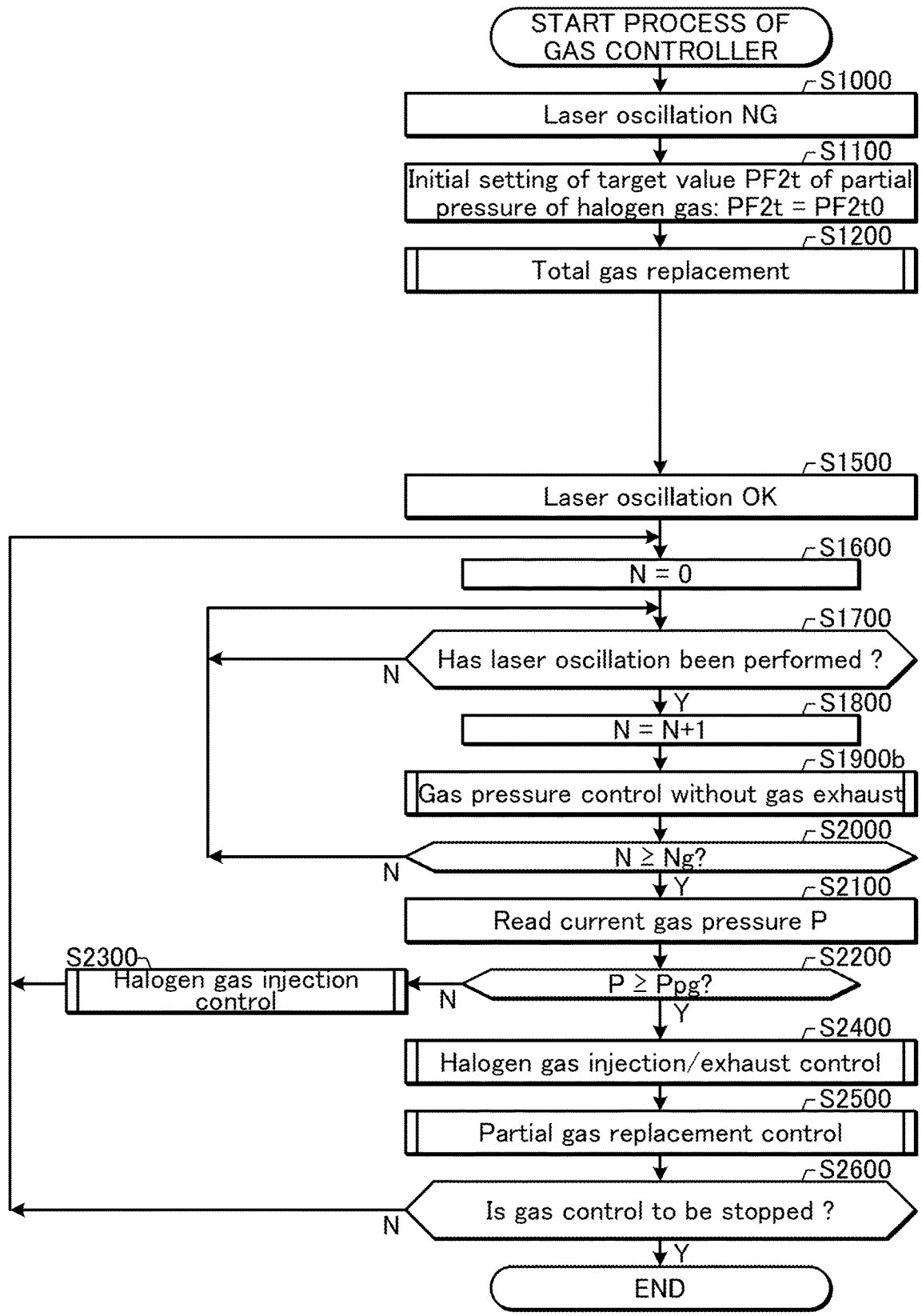
FIG. 9 is a flowchart showing a process of a gas controller 32 of the laser apparatus according to the first embodiment.

FIG. 9 is a flowchart showing a process of the gas controller 32 of the laser apparatus according to the first embodiment. As described below, the gas controller 32 suppresses emission of the gas from the chamber 10 immediately after the total gas replacement.

First, the process from S1000 to S1800 in FIG. 9 is substantially the same as that described with reference to FIG. 3.

Next, at S1900b, the gas controller 32 controls the laser gas control system 40 to perform a gas pressure control without gas exhaust. Details of the gas pressure control without gas exhaust will be described below with reference to FIG. 10.

Next, the process of S2000 in FIG. 9 is substantially the same as the process of S2000 described with reference to FIG. 3.

Next, at S2100, the gas controller 32 reads the gas pressure P in the chamber 10 detected by the pressure sensor 16. Depending on the gas pressure P, the gas controller 32 selects, as described below, one of performing a process that suppresses gas exhaust and performing the process that is substantially the same as the comparative example described above.

At S2200, the gas controller 32 determines whether or not the gas pressure P is higher than or equal to a predetermined threshold value Ppg.

If the gas pressure P is lower than the predetermined threshold value Ppg (S2200: NO), not so large amount of impurities may be included in the laser gas. The gas controller 32 thus controls, at S2300, the laser gas control system 40 to perform a halogen gas injection control without gas exhaust. The gas pressure in the chamber 10 after the process of S2300 is higher than that before the process of S2300. The process of S2300 corresponds to a first gas control in the present disclosure. Details of the process of S2300 will be described below with reference to FIG. 11. After S2300, the gas controller 32 returns to S1600.

If the gas pressure P is higher than or equal to the predetermined threshold value Ppg (S2200: YES), a large amount of impurities may be accumulated in the laser gas. The gas controller 32 thus controls the laser gas control system 40 to perform the halogen gas injection/exhaust control (S2400) and the partial gas replacement control (S2500). The process of S2400, S2500, and S2600 next thereto is substantially the same as the corresponding process described with reference to FIG. 3. An injection amount of the halogen-containing gas at S2400 and a gas exhaust amount in the exhausting process at S2400 are substantially the same with each other. Further, an injection amount of the halogen-containing gas and the buffer gas at S2500 and a gas exhaust amount in the exhausting process at S2500 are substantially the same with each other. The process of S2400 and S2500 corresponds to a second gas control in the present disclosure.

3.2.1.1 Gas Pressure Control without Gas Exhaust

Figure 10:
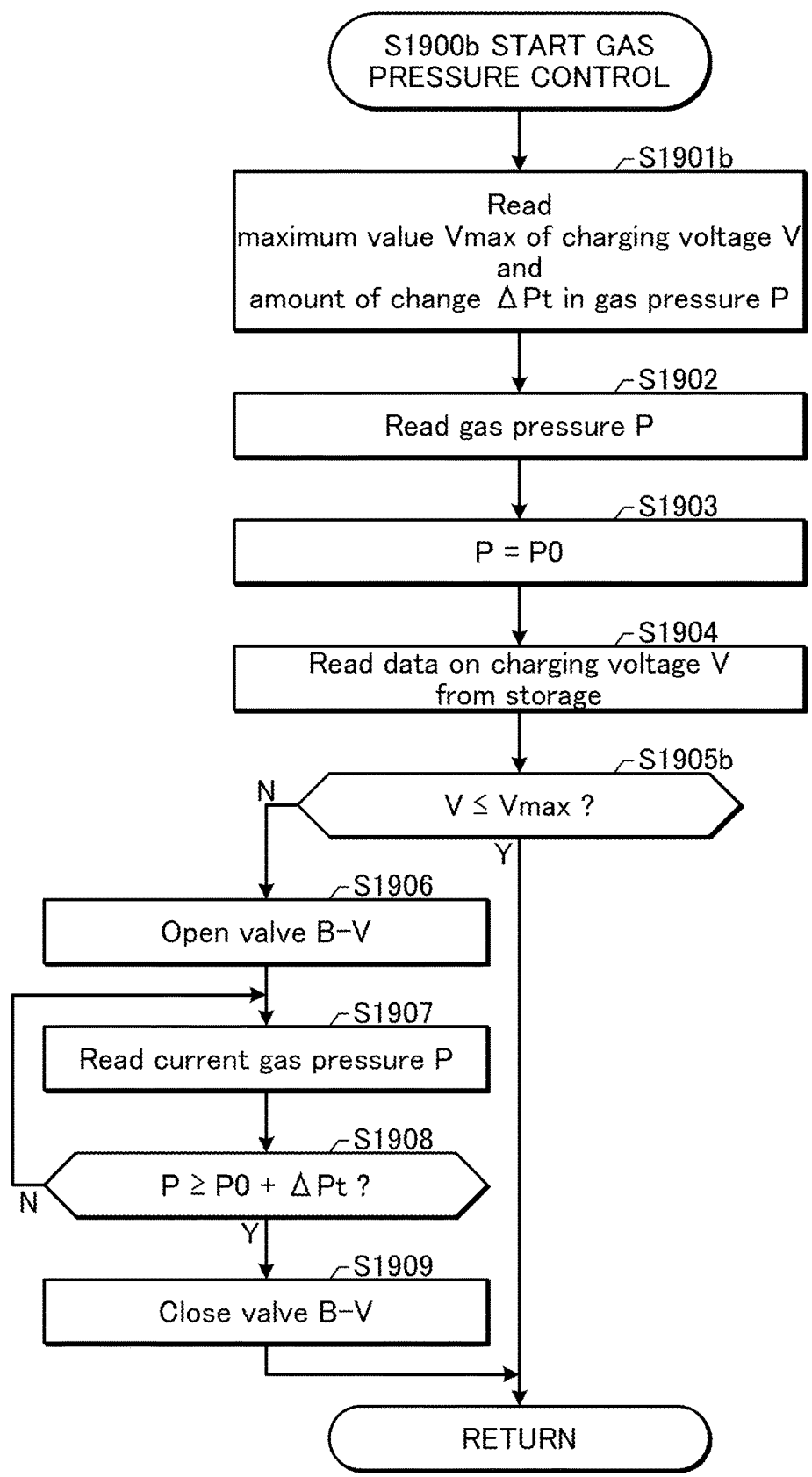
FIG. 10 is a flowchart showing details of a process of a gas pressure control shown in FIG. 9.

FIG. 10 is a flowchart showing details of the process of the gas pressure control shown in FIG. 9. The process shown in FIG. 10 is performed by the gas controller 32 as a subroutine of S1900b shown in FIG. 9.

First, at S1901b, the gas controller 32 reads control parameters of the gas pressure from the storage device. The control parameters of the gas pressure do not include the minimum value Vmin of the charging voltage V. In other aspects, the process of S1901b is substantially the same as the process of S1901 described with reference to FIG. 5.

Next, the process from S1902 to S1904 is substantially the same as that described with reference to FIG. 5.

Next, at S1905b, the gas controller 32 determines whether or not the charging voltage V is lower than or equal to the maximum value Vmax. If the charging voltage V is lower than or equal to the maximum value Vmax (S1905b: YES), the gas controller 32 ends the process of this flowchart and returns to the process shown in FIG. 9.

The process in the case where the charging voltage V is higher than the maximum value Vmax (S1905b: NO) is substantially the same as the process from S1906 to S1909 described with reference to FIG. 5.

In the first embodiment, the determination of whether or not the charging voltage V is higher than or equal to the minimum value Vmin is not performed. Further, the exhausting process from S1910 to S1913 described above with reference to FIG. 5 is not performed. Namely, the process shown in FIG. 10 is performed with the exhausting device kept closed. The laser gas exhaust is thus suppressed in the first embodiment.

3.2.1.2 Halogen Gas Injection Control

Figure 11:
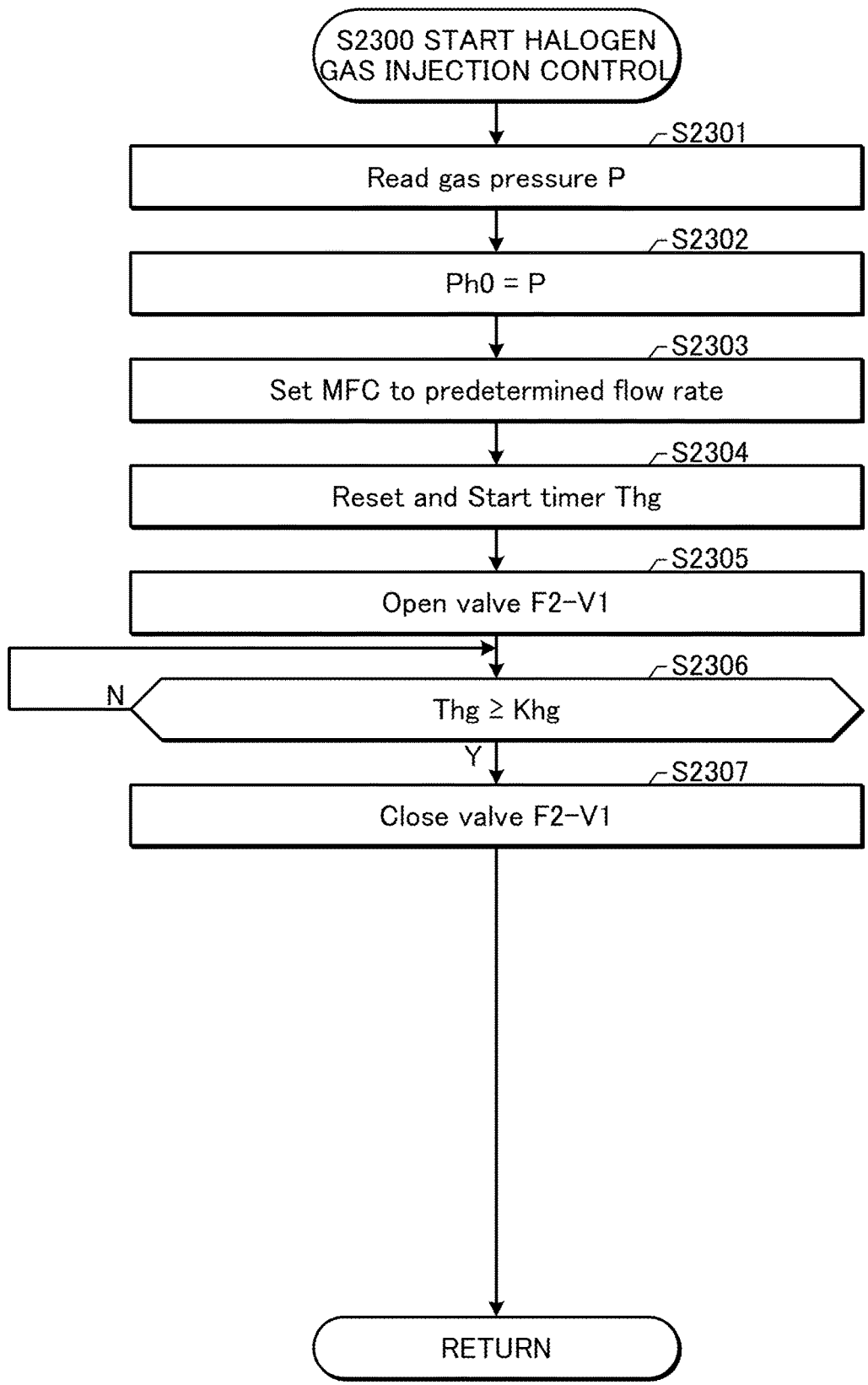
FIG. 11 is a flowchart showing details of a process of a halogen gas injection control shown in FIG. 9.

FIG. 11 is a flowchart showing details of the process of the halogen gas injection control shown in FIG. 9. The process shown in FIG. 11 is performed by the gas controller 32 as a subroutine of S2300 shown in FIG. 9.

The process from S2301 to S2307 shown in FIG. 11 is substantially the same as the process from S2401 to S2407 described above with reference to FIG. 6. The process of FIG. 11 is different from the process of FIG. 6 in that the exhausting process beginning with S2408 is not performed. Namely, the process of FIG. 11 is performed while the laser gas exhaust by the exhausting device is stopped. The gas controller 32 keeps the valves EX-V1 and EX-V2 of the exhausting device closed.

The gas controller 32 then ends the process of this flowchart and returns to the process shown in FIG. 9. Even if the value of the counter N is larger than or equal to the predetermined value Ng, in a period immediately after the total gas replacement is performed and before the gas pressure P in the chamber 10 is increased, the impurity concentration in the chamber 10 would not be high. Therefore, even if the halogen gas injection is performed without gas exhaust as shown in FIG. 11, the reduction in the performance of the laser can be moderated. Since halogen gas injection is performed without gas exhaust, the amount of consumption of the laser gas can be suppressed.

After the gas pressure P in the chamber 10 is increased high, the halogen gas injection/exhaust control (S2400) is performed as described with reference to FIG. 9.

3.3 Effect

Figure 12A:
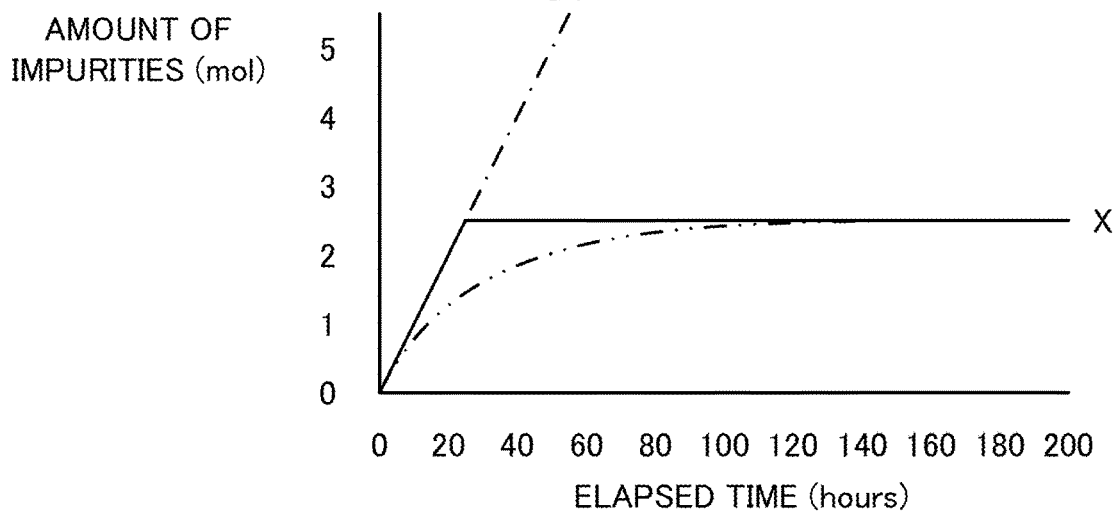
FIG. 12A is a graph showing change in the amount of impurities with elapsed time after a total gas replacement of the laser apparatus.

FIG. 12A is a graph showing change in the amount of impurities with elapsed time after the total gas replacement in a laser apparatus. The amount of impurities in the chamber 10 after the total gas replacement begins with substantially 0.

Then, while controls such as the partial gas replacement with gas exhaust are not performed, the amount of impurities in the chamber 10 increases as shown by a long dashed short dashed line in FIG. 12A. The amount of impurities increases substantially in proportion to the elapsed time.

In contrast, in the comparative example described with reference to FIGS. 3 to 7, the partial gas replacement with gas exhaust is repeated at a constant periodic time after the total gas replacement. In that case, the amount of impurities in the chamber 10 increases as shown by a long dashed double-short dashed line in FIG. 12A. As time elapses, the rate of increase in the amount of impurities decreases and then the amount of impurities is stabilized at a substantially constant value X. The reduction in the performance of the laser is thus moderated.

Figure 12B:
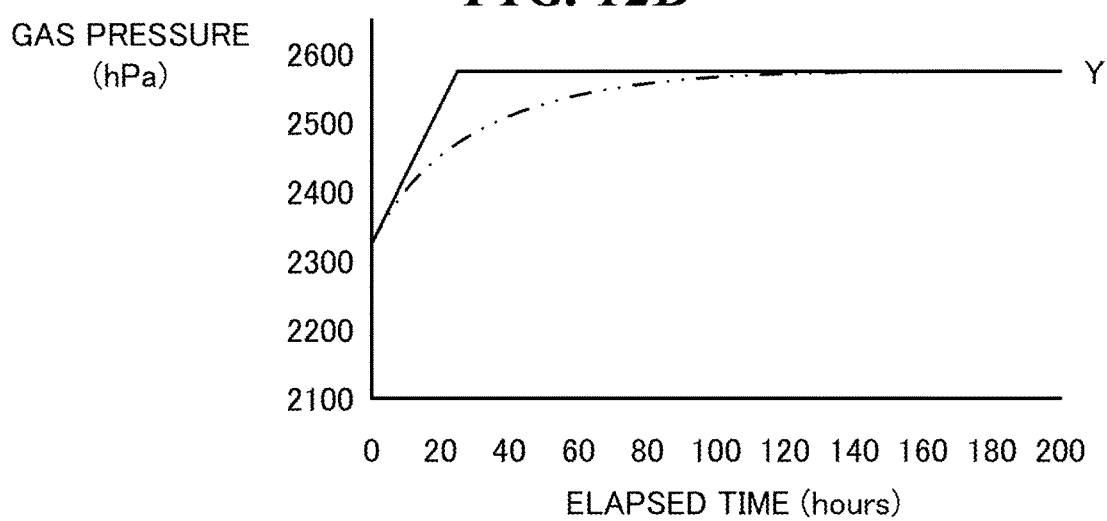
FIG. 12B is a graph showing change in the gas pressure with elapsed time after the total gas replacement of the laser apparatus.

FIG. 12B is a graph showing change in the gas pressure with elapsed time after the total gas replacement in a laser apparatus. In the comparative example described with reference to FIGS. 3 to 7, the gas pressure P in the chamber 10 increases as shown by a long dashed double-short dashed line in FIG. 12B as the amount of impurities increases. Namely, the gas pressure P increases as the amount of impurities increases to moderate the reduction in the pulse energy E. Then, as the rate of increase in the amount of impurities decreases, the rate of increase in the gas pressure P decreases and then the gas pressure P is stabilized at a substantially constant value Y.

Figure 12C:
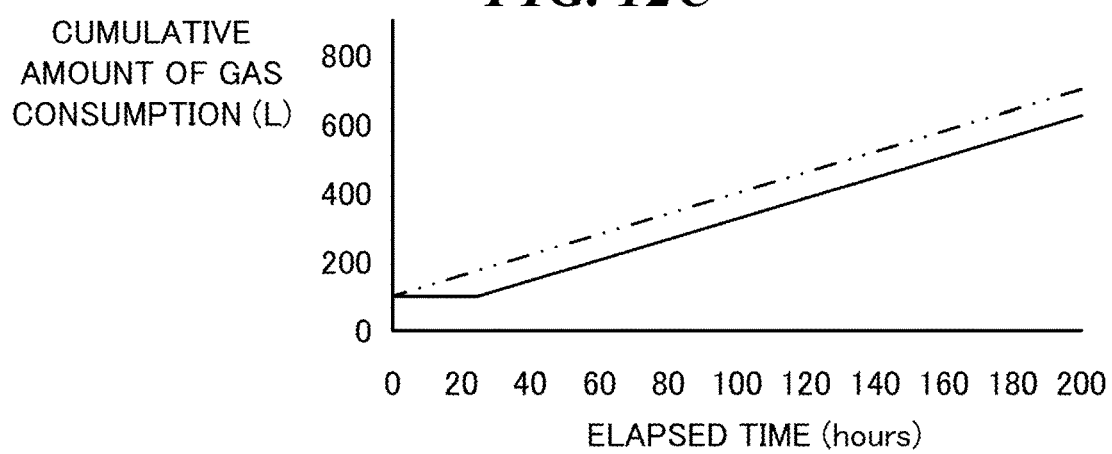
FIG. 12C is a graph showing change in the cumulative amount of gas consumption with elapsed time after the total gas replacement of the laser apparatus.

FIG. 12C is a graph showing change in the cumulative amount of gas consumption with elapsed time after the total gas replacement in a laser apparatus. In the comparative example described with reference to FIGS. 3 to 7, the partial gas replacement with the gas exhaust is performed at a constant periodic time after the total gas replacement. As shown by a long dashed double-short dashed line in FIG. 12C, the cumulative amount of gas consumption increases substantially in proportion to the elapsed time.

As described with reference to FIG. 12A, if the amount of impurities in the chamber 10 is lower than or equal to the value X, the reduction in the performance of the laser can be moderated. Namely, if the amount of impurities in the chamber 10 is not higher than the value X, change in the amount of impurities in the range not higher than the value X is acceptable.

Accordingly, in the first embodiment, until the gas pressure P in the chamber 10 reaches the value Y shown in FIG. 12B, the partial gas replacement with gas exhaust is not performed. Instead, a gas control without gas exhaust is repeated at a constant periodic time. Thus, as shown by a solid line in FIG. 12A, the amount of impurities in the chamber 10 increases substantially in proportion to the elapsed time up to the value around X. As the amount of impurities in the chamber 10 increases, the gas pressure P also increases to suppress the reduction in the pulse energy E as shown by a solid line in FIG. 12B.

In the first embodiment, after the gas pressure P in the chamber 10 reaches the value Y, a gas control such as the partial gas replacement with gas exhaust is repeated at a constant periodic time substantially in the same manner as the comparative example described above. Thus, the amount of impurities in the chamber 10 becomes stable around the value X. As the amount of impurities becomes stable, the gas pressure P in the chamber 10 is stabilized at the substantially constant value Y.

As described above, the gas exhaust is not performed in the first embodiment until the gas pressure P in the chamber 10 reaches the value Y. Thus, as shown by a solid line in FIG. 12C, the cumulative amount of gas consumption does not change until the gas pressure P in the chamber 10 reaches the value Y. After the gas pressure P in the chamber 10 reaches the value Y, the cumulative amount of gas consumption increases in substantially the same manner as the comparative example. As shown in FIG. 12C, in the first embodiment, the amount of consumption of the gas can be reduced as compared to the comparative example.

3.4 Correction of Pressure

Figure 13:
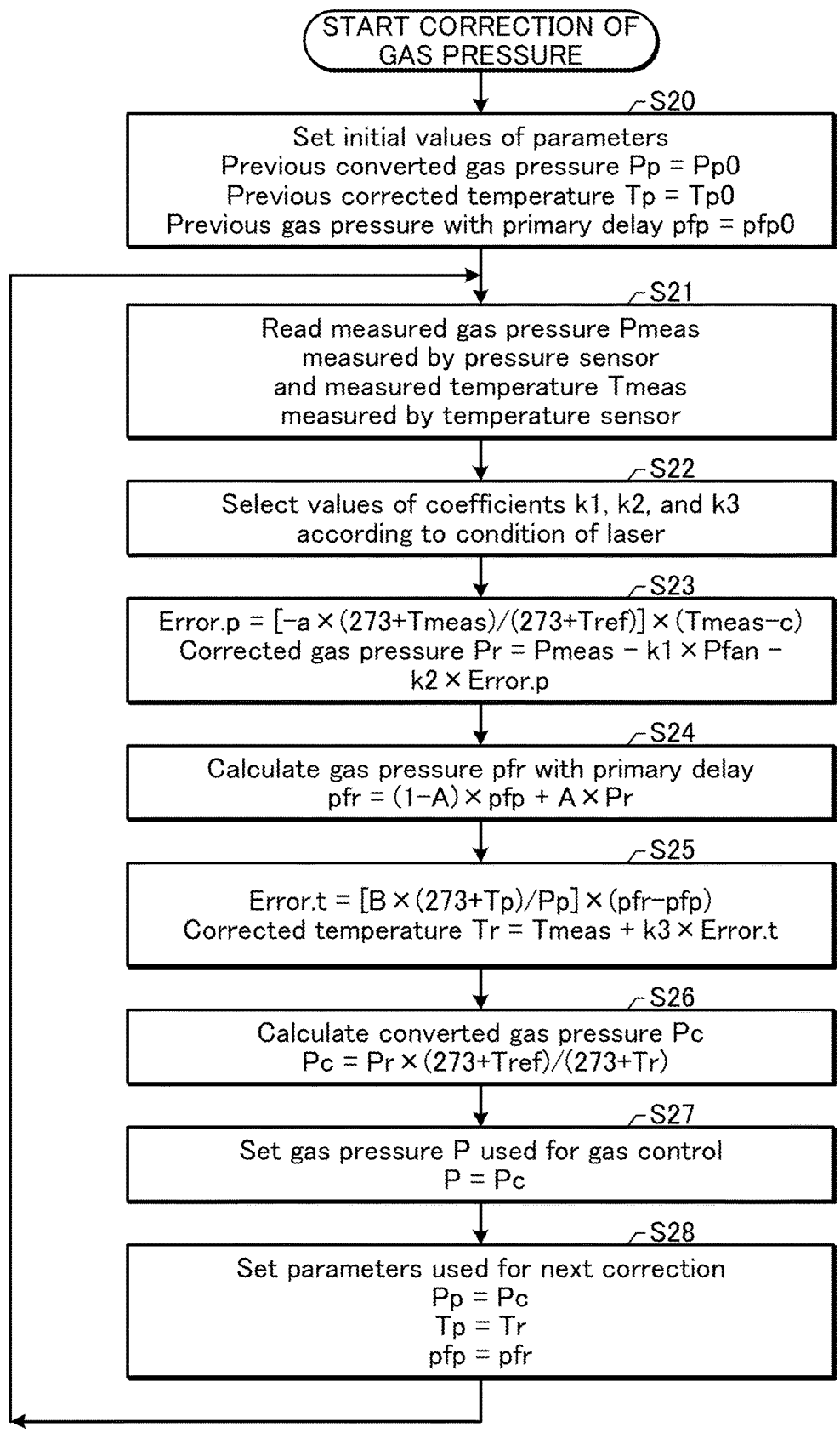
FIG. 13 is a flowchart showing a process of a correction of gas pressure of the laser apparatus according to the first embodiment.

FIG. 13 is a flowchart showing a process of a correction of gas pressure in the laser apparatus according to the first embodiment. When the gas control described above is performed, it is preferable that the measured value of the gas pressure P is corrected as follows and the corrected gas pressure is used.

First, if the pressure sensor 16 has thermal behavior, it is preferable that the measured value of the gas pressure P is corrected to remove the influence of the temperature of the laser gas. Further, it is preferable that the measured value of the gas pressure P is corrected according to the operational status of the cross-flow fan 21. Such correction is described below at S23.

Second, even if the number of moles of the laser gas is constant, the gas pressure changes with the temperature of the laser gas according to the combined gas law. Accordingly, it is preferable that the gas pressure is converted to a gas pressure in a constant reference temperature Tref based on the temperature of the laser gas and the gas pressure. Such conversion is described below at S26.

Third, if the responsiveness of the pressure sensor 16 and the responsiveness of the temperature sensor 19 are different from each other, accurate conversion is difficult with the combined gas law using the measured data itself. Thus, it is preferable that the measured value of the temperature is corrected considering the gas pressure with a primary delay. Such correction is described below at S24 and S25.

With reference to FIG. 13, at S20, the laser controller 30 sets initial values of some parameters as follows.

A previous converted gas pressure Pp is set to an initial value Pp0.

A previous corrected temperature Tp is set to an initial value Tp0.

A previous gas pressure pfp with a primary delay is set to an initial value pfp0.

The values of these parameters Pp, Tp, and pfp will be set again at S28 described below. However, when this flowchart is executed for the first time, the data to be set at S28 does not exist. Accordingly, the initial values prepared in advance are set at S20.

Next, at S21, the laser controller 30 reads a measured gas pressure Pmeas measured by the pressure sensor 16 and a measured temperature Tmeas measured by the temperature sensor 19.

Next, at S22, the laser controller 30 selects values of coefficients k1, k2, and k3 according to the condition of the laser.

As a value of the coefficient k1, for example, 1 is selected when the cross-flow fan 21 is in an operating state. Otherwise, 0 is selected.

As a value of the coefficient k2, for example, 0 is selected when it is immediately after starting the laser or the temperature sensor has some trouble. Otherwise, 1 is selected.

As a value of the coefficient k3, for example, 1 is selected when the cross-flow fan 21 is in an operating state or the laser is in a stopped state. Otherwise, 0 is selected.

Next, at S23, the laser controller 30 calculates a correction coefficient Error.p according to the thermal behavior of the pressure sensor 16 by the following formula.

$$Error.p=[-a\times(273+Tmeas)/(273+Tref)]\times(Tmeas-c)$$

Here, Tref is the reference temperature and a is a coefficient that is set based on values obtained in advance by experiments. Further, c is a temperature where no error due to thermal behavior is supposed to exist. It may have the same value as the reference temperature Tref.

Further, at S23, the laser controller 30 calculates a corrected gas pressure Pr based on the correction coefficient Error.p and the operational status of the cross-flow fan 21 by the following formula.

$$Pr=Pmeas-k1\times Pfan-k2\times Error.p$$

Here, k1 and k2 are the coefficients selected at S22. Pfan is the difference in pressure in the chamber 10 between ON and OFF of the cross-flow fan 21. Pfan is set in advance based on values obtained by experiments.

Next, at S24, the laser controller 30 calculates a gas pressure pfr with a primary delay by the following formula.

$$Pfr=(1-A)\times pfp+A\times Pr$$

Here, A is a constant of primary delay depending on characteristics of the pressure sensor 16. A is set in advance based on values obtained by experiments. Further, pfp is the previous gas pressure with a primary delay that is set at S20 or S28. Pr is the corrected gas pressure calculated at S23.

Next, at S25, the laser controller 30 calculates a correction coefficient Error.t according to the gas pressure pfr with a primary delay and the previous gas pressure pfp with a primary delay by the following formula.

$$Error.t=[B\times(273+Tp)/Pp]\times(pfr-pfp)$$

Here, B is a coefficient that is set in advance based on values obtained by experiments. Tp is the previous corrected temperature that is set at S20 or S28. Pp is the previous converted gas pressure that is set at S20 or S28.

Further, at S25, the laser controller 30 calculates a corrected temperature Tr based on the correction coefficient Error.t by the following formula.

$$Tr=Tmeas+k3\times Error.t$$

Here, k3 is the coefficient selected at S22.

Next, at S26, the laser controller 30 calculates the converted gas pressure Pc that is converted to a gas pressure in the reference temperature Tref by the following formula.

$$Pc=Pr\times(273+Tref)/(273+Tr)$$

Next, at S27, the laser controller 30 sets the value of the gas pressure P used for the gas control to the value of Pc calculated at S26. The value of the gas pressure P is sent to the gas controller 32 or stored in a storage device readable for the gas controller 32.

Next, at S28, the laser controller 30 sets the parameters used for the next correction of gas pressure as follows.

The previous converted gas pressure Pp is set to the value of the converted gas pressure Pc calculated this time such that the value is used as the previous converted gas pressure Pp in the next correction of gas pressure.

The previous corrected temperature Tp is set to the value of the corrected temperature Tr calculated this time such that the value is used as the previous corrected temperature Tp in the next correction of gas pressure.

The previous gas pressure pfp with a primary delay is set to the value of the gas pressure pfr with a primary delay calculated this time such that the value is used as the previous gas pressure pfp with a primary delay in the next correction of gas pressure.

After S28, the laser controller 30 returns to S21.

By the process shown in FIG. 13, accuracy in measuring the gas pressure in the chamber improves. When the gas control of the present disclosure is performed, the partial pressure of fluorine gas and the concentration of gaseous impurities are stabilized at high accuracy to the respective target values. Thus, the performance of the laser is stabilized and the amount of laser gas consumption is reduced.

4. LASER APPARATUS THAT UPDATES PREDETERMINED THRESHOLD VALUE BY ADJUSTING OSCILLATION AFTER TOTAL GAS REPLACEMENT

4.1 Configuration

Figure 14:
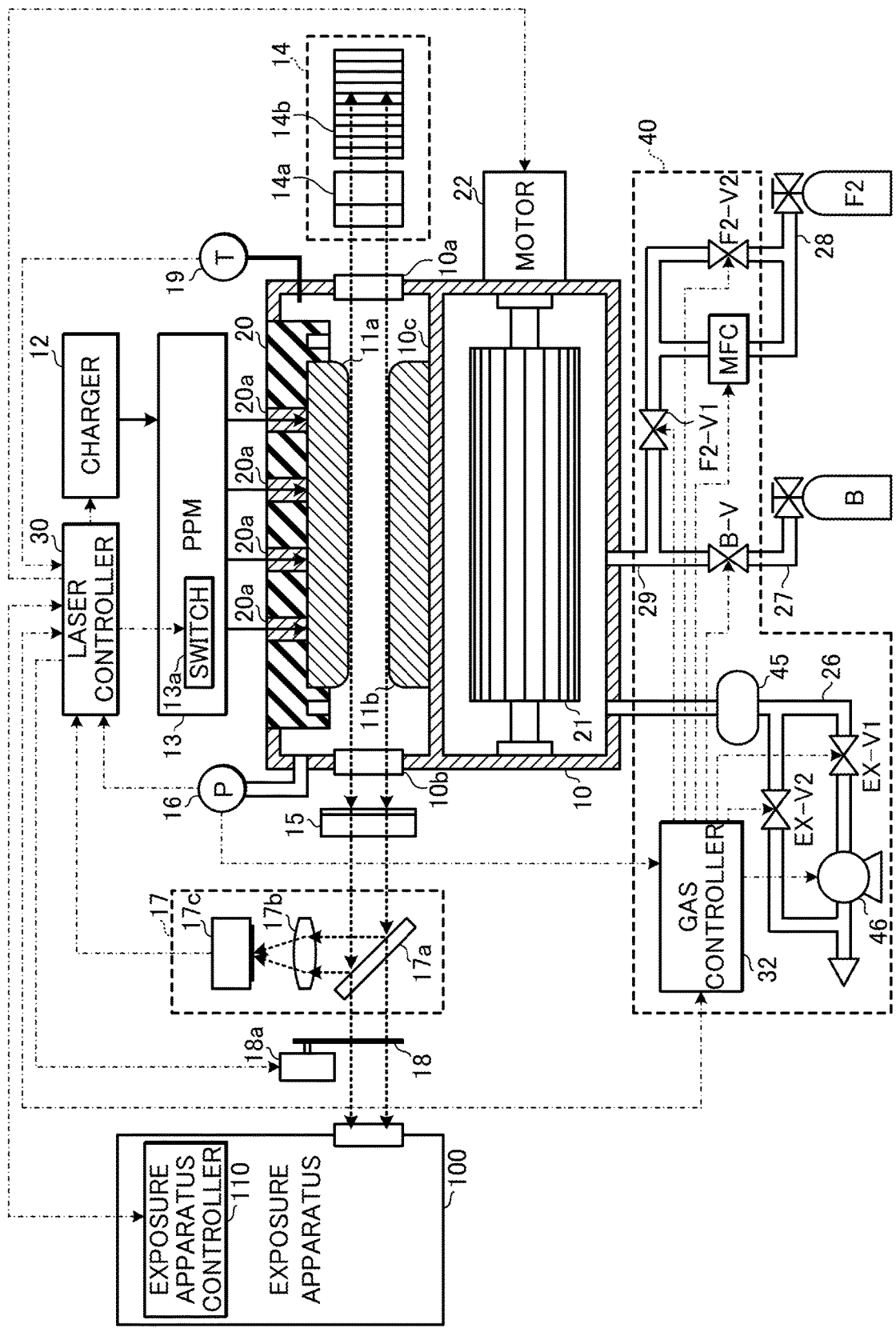
FIG. 14 schematically shows a configuration of a laser apparatus according to a second embodiment of the present disclosure.

FIG. 14 schematically shows a configuration of a laser apparatus according to a second embodiment of the present disclosure. The excimer laser apparatus in the second embodiment includes an emitting port shutter 18.

The emitting port shutter 18 is provided in the optical path of the pulse laser beam between the energy monitor 17 and the exposure apparatus 100. The emitting port shutter 18 includes an actuator 18a. The actuator 18a is capable of switching between blocking the pulse laser beam by the emitting port shutter 18 and allowing the pulse laser beam to be outputted to the exposure apparatus 100. The actuator 18a is controlled by the laser controller 30.

In other aspects, the configuration of the second embodiment is substantially the same as that of the first embodiment described above with reference to FIG. 8.

4.2 Operation

In the laser apparatus according to the second embodiment, the process of the energy control by the laser controller 30 is substantially the same as that of the comparative example described above with reference to FIG. 2.

4.2.1 Laser Gas Control

Figure 15:
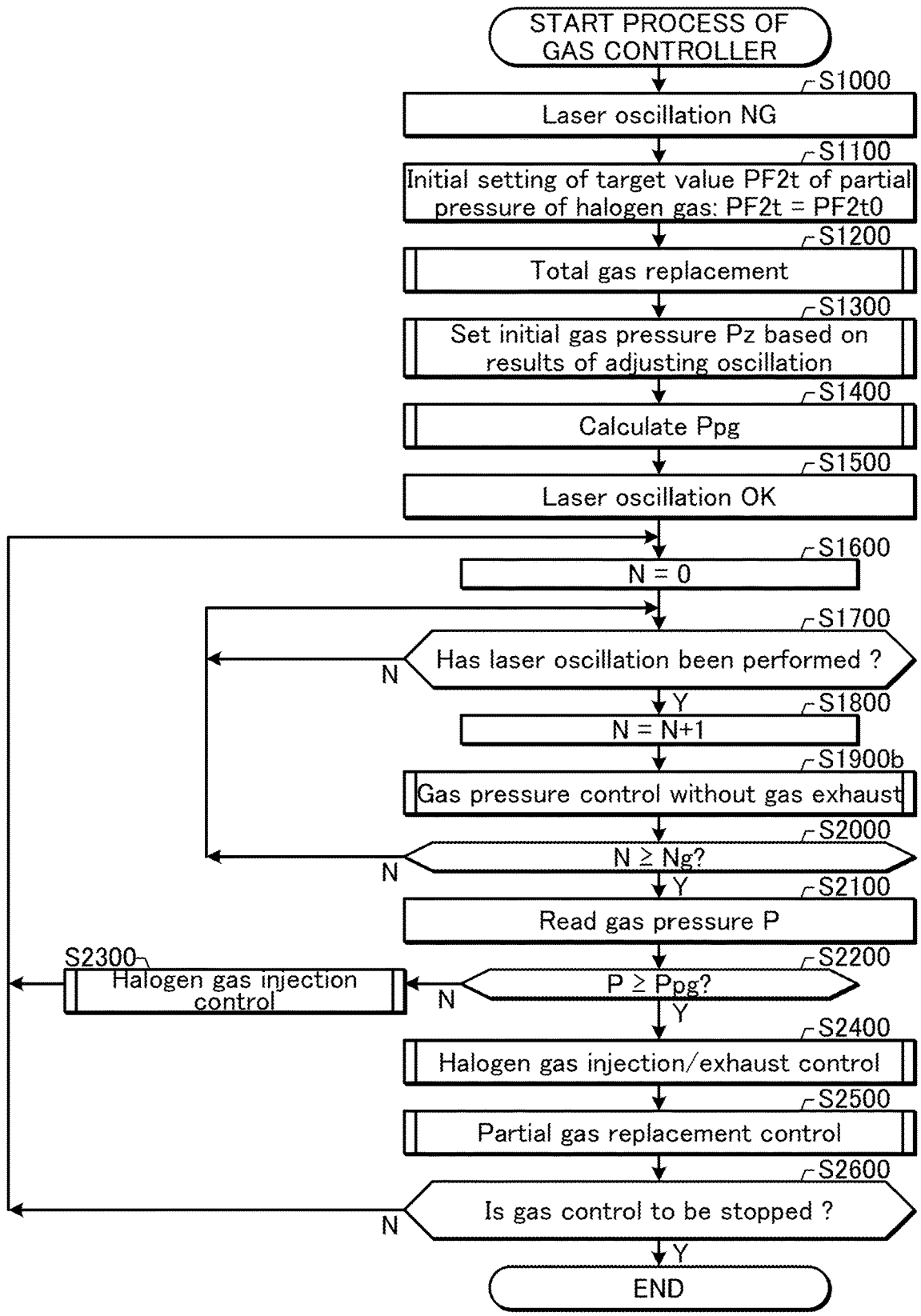
FIG. 15 is a flowchart showing a process of a gas controller 32 of the laser apparatus according to the second embodiment.

FIG. 15 is a flowchart showing a process of the gas controller 32 of the laser apparatus according to the second embodiment. As described below, in the second embodiment, adjusting oscillation is performed immediately after the total gas replacement to calculate the predetermined threshold value Ppg. The predetermined threshold value Ppg is the threshold value used for determining at S2200 whether the gas control (S2300) without gas exhaust is performed or the gas control (S2400 or S2500) with gas exhaust is performed.

First, the process from S1000 to S1200 in FIG. 15 is substantially the same as that described above with reference to FIG. 9. However, in the total gas replacement in S1200, the target value Pt of gas pressure should be set to a low value. Thus, the adjusting oscillation at the next S1300 is started from a low value of gas pressure.

Next, at S1300, based on the results of the adjusting oscillation performed by the laser controller 30, the gas controller 32 sets an initial gas pressure Pz to a minimum gas pressure that satisfies conditions. Details of the process of S1300 will be described with reference to FIG. 16.

Next, at S1400, the gas controller 32 calculates the predetermined threshold value Ppg based on the initial gas pressure Pz. Details of the process of S1400 will be described with reference to FIG. 17.

The process of S1500 and the subsequent process of FIG. 15 are substantially the same as those described with reference to FIG. 9.

4.2.1.1 Setting of Initial Gas Pressure Pz

Figure 16:
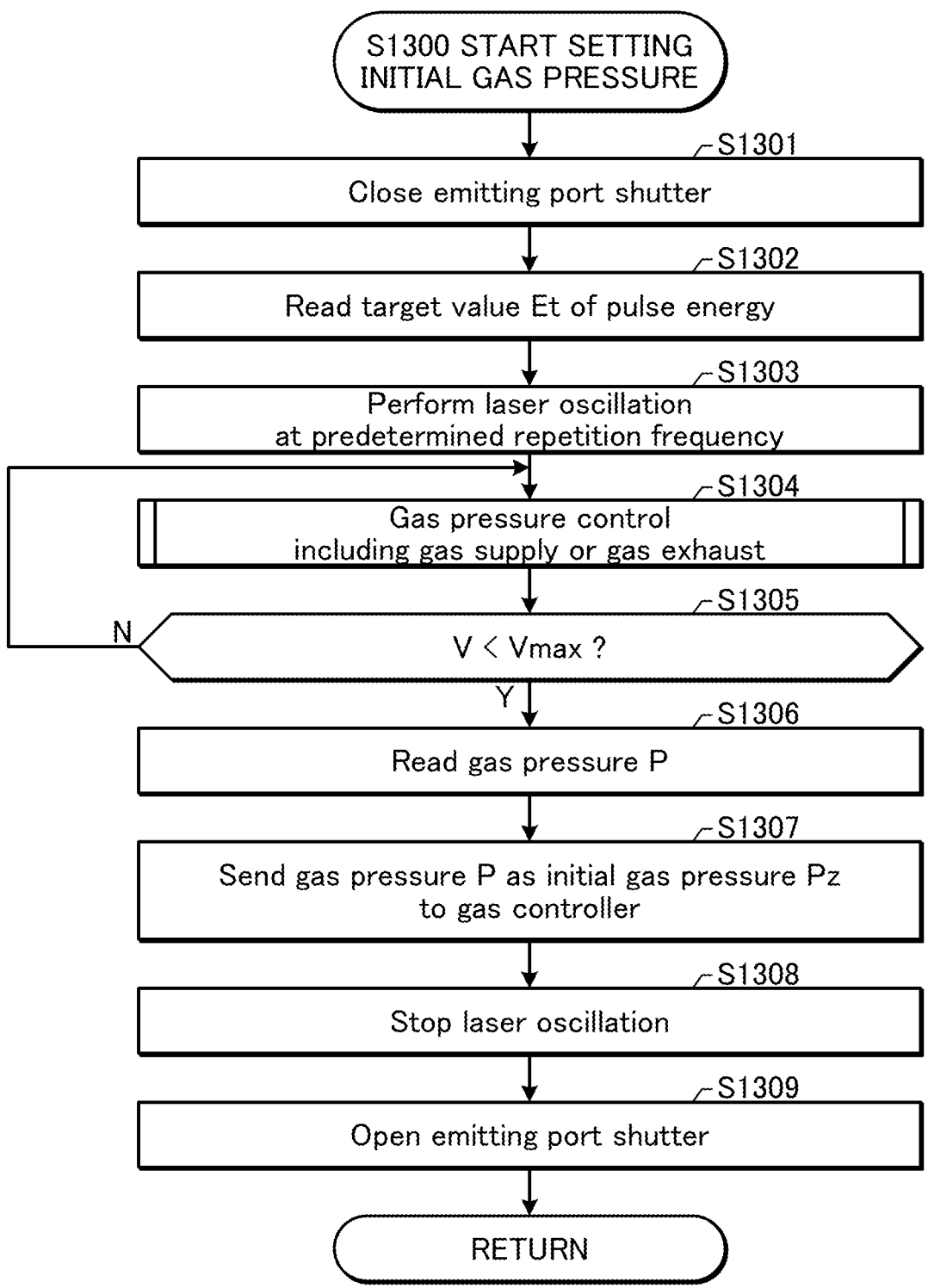
FIG. 16 is a flowchart showing an operation of adjusting oscillation and an operation of setting initial gas pressure shown in FIG. 15.

FIG. 16 is a flowchart showing the operation of the adjusting oscillation and the operation of setting the initial gas pressure shown in FIG. 15. Since the process of FIG. 16 includes the adjusting oscillation, it is performed by the laser controller 30. The gas controller 32 sets the initial gas pressure Pz based on the results of the adjusting oscillation.

First, at S1301, the laser controller 30 closes the emitting port shutter 18. This suppresses output of the pulse laser beam to the outside of the laser apparatus during the adjusting oscillation.

Next, at S1302, the laser controller 30 reads the target value Et of pulse energy of the laser beam. The target value Et is, for example, a value set by the exposure apparatus controller 110.

Next, at S1303, the laser controller 30 has laser oscillation be started at a predetermined repetition frequency. The predetermined repetition frequency is, for example, selected from the range of the rated value of repetition frequency.

Next, at S1304, the laser controller 30 sends a control signal to the gas controller 32 to have the gas controller 32 execute the gas pressure control including gas supply or gas exhaust. The gas pressure control is substantially the same as that in S1900a described with reference to FIGS. 3 and 5.

As described with reference to FIG. 15, the gas pressure after the total gas replacement has been set at a low value. Thus, at the beginning of the adjusting oscillation, to achieve output pulse energy not lower than the target value Et of pulse energy, the charging voltage V is high. The gas pressure control starts from this state. Then, the gas pressure gradually increases and the charging voltage V gradually decreases.

Next, at S1305, the laser controller 30 determines whether or not the charging voltage V is lower than the maximum value Vmax used in S1900a. If the charging voltage V is not lower than the maximum value Vmax (S1305: NO), the laser controller 30 returns to S1304 to repeat the gas pressure control and gradually increase the gas pressure. If the charging voltage V is lower than the maximum value Vmax (S1305: YES), the gas pressure in the chamber 10 would be around the minimum gas pressure to achieve the target value Et of pulse energy. The laser controller 30 reads, at S1306, the gas pressure P in the chamber 10 detected by the pressure sensor 16.

Next, at S1307, the laser controller 30 sends the gas pressure P as the initial gas pressure Pz to the gas controller 32. The gas controller 32 sets the value received from the laser controller 30 as the initial gas pressure Pz.

Next, at S1308, the laser controller 30 stops the laser oscillation.

Next, at S1309, the laser controller 30 opens the emitting port shutter 18. This allows the subsequently generated pulse laser beam to be outputted to the outside of the laser apparatus.

After S1309, the laser controller 30 ends the process of this flowchart.

4.2.1.2 Calculation of Predetermined Threshold Value Ppg

Figure 17:
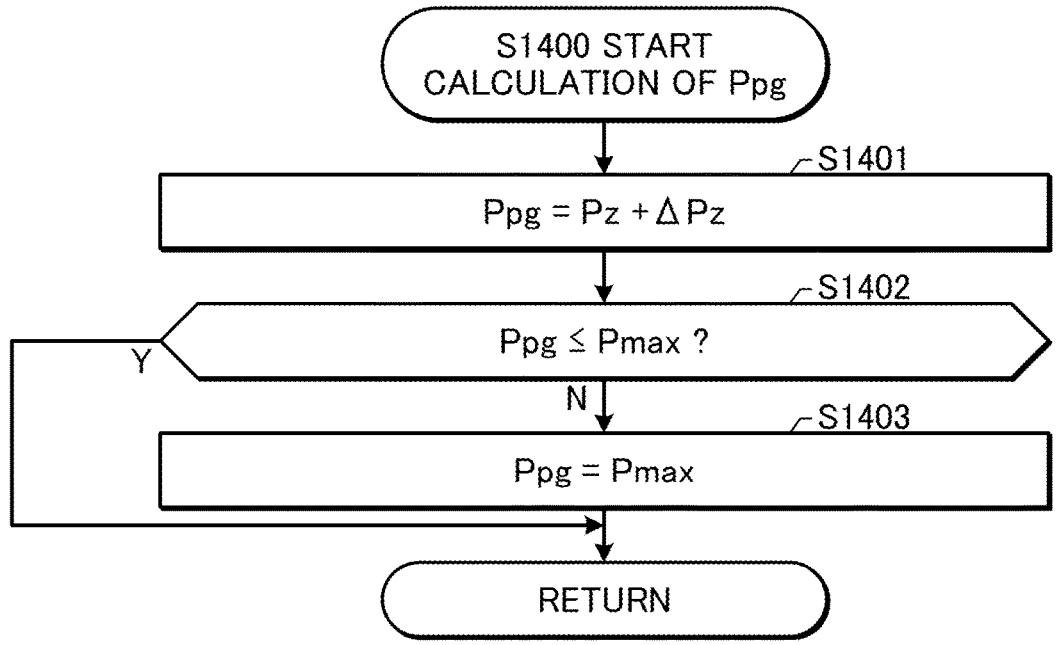
FIG. 17 is a flowchart showing a calculating process of a predetermined threshold value shown in FIG. 15.

FIG. 17 is a flowchart showing a calculating process of the predetermined threshold value shown in FIG. 15. The process shown in FIG. 17 is performed by the gas controller 32 as a subroutine of S1400 shown in FIG. 15.

First, at S1401, the gas controller 32 adds a positive constant value ΔPz to the initial gas pressure Pz to calculate the predetermined threshold value Ppg.

Next, at S1402, the gas controller 32 determines whether or not the calculated predetermined threshold value Ppg is lower than or equal to an acceptable maximum value Pmax of the gas pressure.

If the predetermined threshold value Ppg is lower than or equal to the acceptable maximum value Pmax (S1402: YES), the gas controller 32 ends the process of this flowchart without changing the predetermined threshold value Ppg calculated at S1401. If the predetermined threshold value Ppg is higher than the acceptable maximum value Pmax (S1402: NO), the gas controller 32 changes, at S1403, the predetermined threshold value Ppg to the acceptable maximum value Pmax. Then, the gas controller 32 ends the process of this flowchart.

Figure 18:
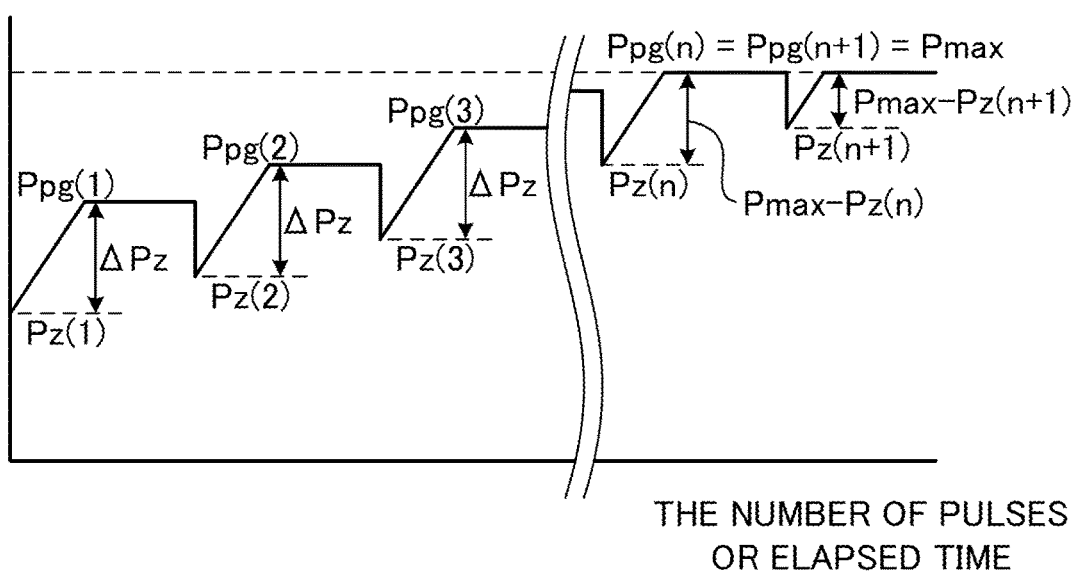
FIG. 18 is a graph showing change in the gas pressure of the laser apparatus with the number of pulses or elapsed time.

FIG. 18 is a graph showing change in the gas pressure of laser apparatus with the number of pulses or elapsed time. The graph shown in FIG. 12B shows the change in the gas pressure for a short period after ending a total gas replacement and before starting the next total gas replacement. However, FIG. 18 shows the change in the gas pressure for a long period including more than one total gas replacement.

When the discharge electrodes 11a and 11b included in the laser apparatus are new and the efficiency of generating laser beam is high, the initial gas pressure Pz after the first total gas replacement is set to a relatively low value Pz(1). A value obtained by adding the positive constant value ΔPz to the value Pz(1) of the initial gas pressure serves as a predetermined threshold value Ppg(1).

When a second total gas replacement is performed next to the first total gas replacement, the discharge electrodes 11a and 11b may be slightly deteriorated. In that case, the value Pz(2) of the initial gas pressure after the second total gas replacement is higher than the value Pz(1) of the initial gas pressure after the first total gas replacement. A value obtained by adding the positive constant value ΔPz to the value Pz(2) of the initial gas pressure serves as a predetermined threshold value Ppg(2).

As deterioration of the discharge electrodes proceeds, the initial gas pressure Pz and the predetermined threshold value Ppg each increases little by little at every total gas replacement.

If a value obtained by adding the positive constant value ΔPz to the value Pz(n) of the initial gas pressure after the nth total gas replacement exceeds the acceptable maximum value Pmax of the gas pressure, the predetermined threshold value Ppg(n) is set to Pmax.

If a value obtained by adding the positive constant value ΔPz to the value Pz(n+1) of the initial gas pressure after the (n+1) th total gas replacement exceeds the acceptable maximum value Pmax of the gas pressure, a predetermined threshold value Ppg(n+1) is also set to Pmax.

5. LASER APPARATUS THAT PERFORMS GAS CONTROL CONSIDERING ELAPSED TIME

Figure 19:
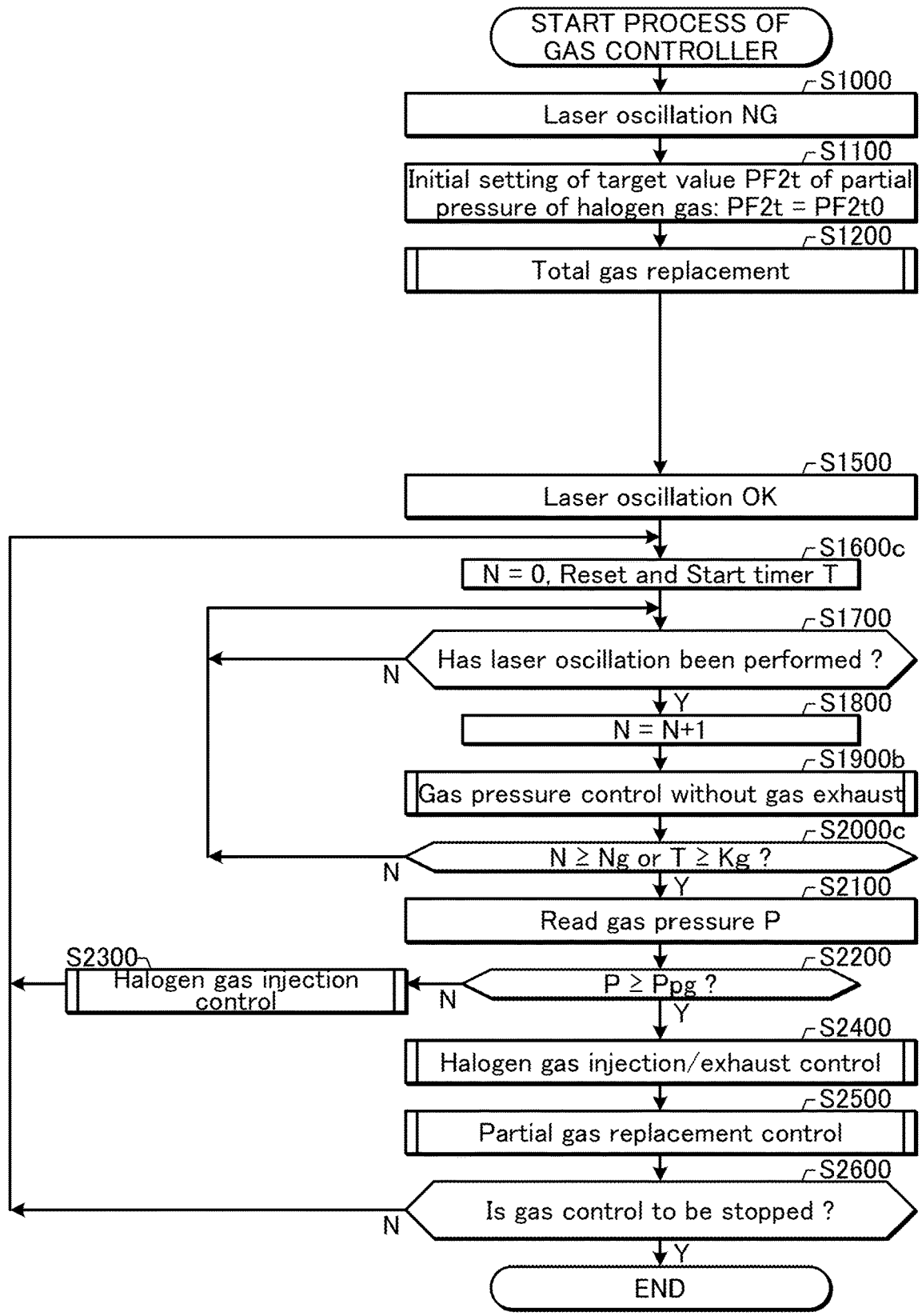
FIG. 19 is a flowchart showing a process of a gas controller 32 of the laser apparatus according to a third embodiment of the present disclosure.

FIG. 19 is a flowchart showing a process of the gas controller 32 in the laser apparatus according to a third embodiment of the present disclosure. In the first embodiment shown in FIG. 9, whether or not the gas control is to be performed is decided based on whether or not the value of the counter N corresponding to the number of pulses after the gas control reaches a predetermined value Ng. However, the present disclosure is not limited to this. As described below, in the third embodiment, not only the number of pulses but also the elapsed time after the previous gas control is considered for performing the next gas control.

First, the process from S1000 to S1500 of FIG. 19 is substantially the same as that described with reference to FIG. 9.

Next, at S1600c, the gas controller 32 resets and starts a timer T, in addition to setting the value of the counter N to measure the number of pulses to the initial value 0.

The process from the next S1700 to S1900b is substantially the same as that described above with reference to FIG. 9.

Next, at S2000c, the gas controller 32 compares the value of the timer T with a predetermined value Kg, in addition to comparing the value of the counter N with the predetermined value Ng. If the value of the counter N is larger than or equal to the predetermined value Ng, the gas controller 32 proceeds to S2100. If the value of the timer T is larger than or equal to the predetermined value Kg, the gas controller 32 also proceeds to S2100.

The process of the next S2100 and subsequent process are substantially the same as the process of S2100 and subsequent process described above with reference to FIG. 9.

According to the third embodiment, the gas control is performed not only when the number of pulses reaches the predetermined value Ng but also when the elapsed time reaches the predetermined value Kg. The gas control is thus performed at the more appropriate timing.

6. CONFIGURATION OF CONTROLLER

Figure 20:
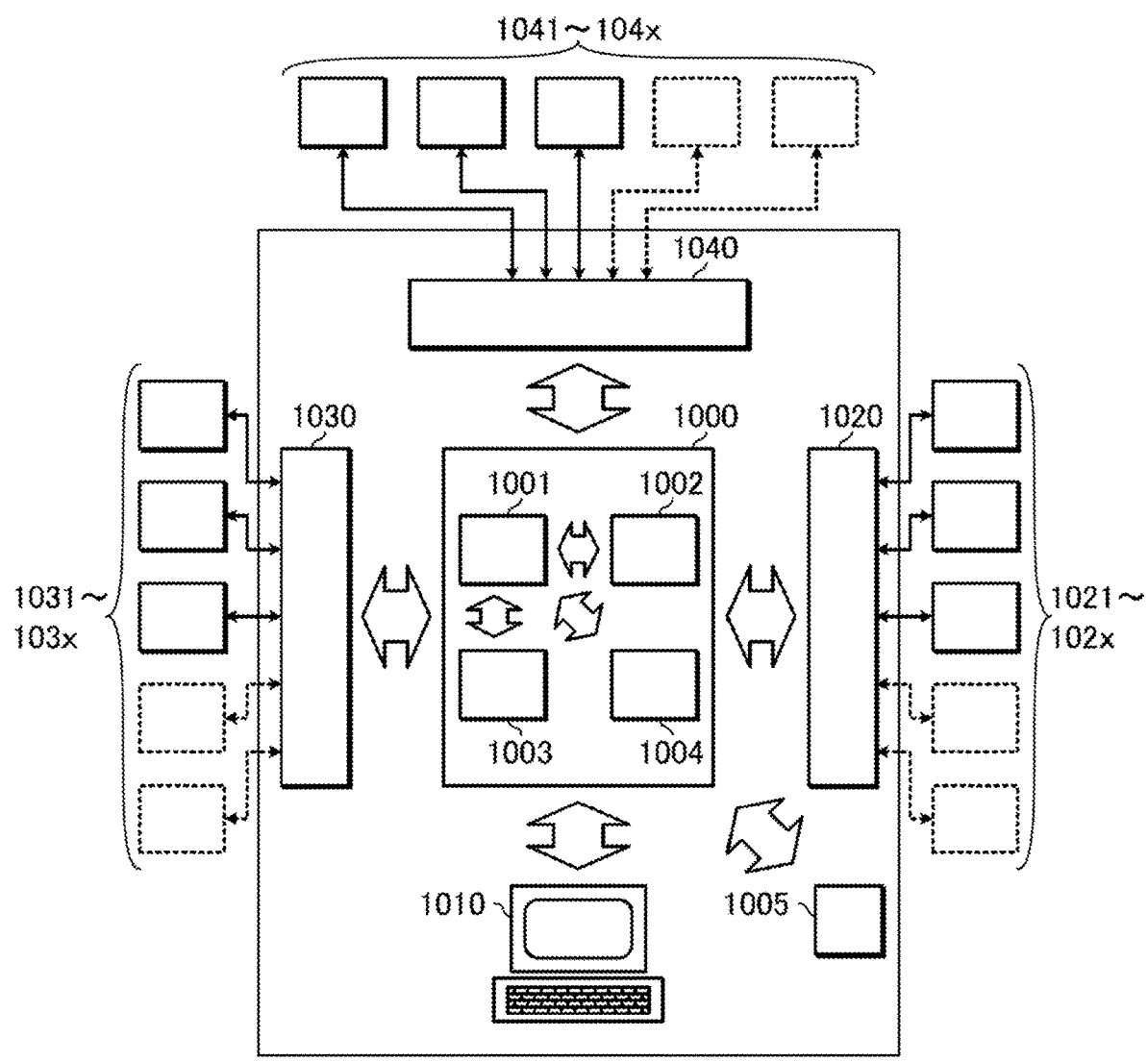
FIG. 20 is a block diagram schematically showing a configuration of a controller.

FIG. 20 is a block diagram schematically showing a configuration of the controller.

Controllers of the above-described embodiments, such as the gas controller 32, may be general-purpose control devices, such as computers or programmable controllers. For example, the controllers may be configured as follows.

Configuration

The controllers may each include a processor 1000, and a storage memory 1005, a user interface 1010, a parallel input/output (I/O) controller 1020, a serial I/O controller 1030, and an analog-to-digital (A/D) and digital-to-analog (D/A) converter 1040 which are connected to the processor 1000. The processor 1000 may include a central processing unit (CPU) 1001, and a memory 1002, a timer 1003, and a graphics processing unit (GPU) 1004 which are connected to the CPU 1001.

Operation

The processor 1000 may read a program stored in the storage memory 1005, execute the read program, read data from the storage memory 1005 in accordance with the program, or store data in the storage memory 1005.

The parallel I/O controller 1020 may be connected to devices 1021 to 102x with which it may communicate through parallel I/O ports. The parallel I/O controller 1020 may control digital-signal communication through the parallel I/O ports while the processor 1000 executes the program.

The serial I/O controller 1030 may be connected to devices 1031 to 103x with which it may communicate through serial I/O ports. The serial I/O controller 1030 may control digital-signal communication through the serial I/O ports while the processor 1000 executes the program.

The A/D and D/A converter 1040 may be connected to devices 1041 to 104x with which it may communicate through analog ports. The A/D and D/A converter 1040 may control analog-signal communication through the analog ports while the processor 1000 executes the program.

The user interface 1010 may be configured to display the progress of the program being executed by the processor 1000 in accordance with instructions from an operator, or to cause the processor 1000 to stop the execution of the program or perform an interrupt in accordance with instructions from the operator.

The CPU 1001 of the processor 1000 may perform arithmetic processing of the program. The memory 1002 may temporarily store the program being executed by the CPU 1001 or temporarily store data in the arithmetic processing. The timer 1003 may measure time or elapsed time and output it to the CPU 1001 in accordance with the program being executed. When image data is inputted to the processor 1000, the GPU 1004 may process the image data in accordance with the program being executed and output the results to the CPU 1001.

The devices 1021 to 102x, which are connected through the parallel I/O ports to the parallel I/O controller 1020, may be the exposure apparatus 100 that sends the oscillation trigger signal and the setting data signal of the target value of pulse energy, or other controllers or the like. Alternatively, the devices 1021 to 102x may be the charger 12 that receives the setting data signal of the charging voltage, the valves B-V, F2-V1, and EX-V1, or the like.

The devices 1031 to 103x, which are connected through the serial I/O ports to the serial I/O controller 1030, may be the actuator 18a of the emitting port shutter 18, or the like.

The devices 1041 to 104x, which are connected through the analog ports to the A/D and D/A converter 1040, may be various sensors such as the pressure sensor 16, the optical sensor 17c, or the like.

The controllers thus configured may be capable of realizing the operations described in the embodiments.

The above descriptions are intended to be only illustrative rather than being limiting. Accordingly, it will be clear to those skilled in the art that various changes may be made to the embodiments of the present disclosure without departing from the scope of the appended claims.

The terms used in the present specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in the present specification and the appended claims should be interpreted as meaning "at least one" or "one or more".

The invention claimed is:

1. A laser apparatus comprising:
    a chamber in which a pair of discharge electrodes is provided;
    a gas supply device configured to supply first laser gas including halogen gas and second laser gas having a halogen gas concentration lower than the first laser gas to the chamber;
    an exhausting device configured to exhaust laser gas in the chamber;
    a pressure sensor configured to measure gas pressure in the chamber;
    a controller configured to select one of a first gas control and a second gas control based on the gas pressure measured by the pressure sensor,
        the first gas control causing the first laser gas to be supplied to the chamber such that the gas pressure in the chamber after the first gas control is higher than the gas pressure in the chamber before the first gas control, the second gas control causing at least one of the first laser gas and the second laser gas to be supplied to the chamber and causing a part of the laser gas in the chamber to be exhausted such that a difference between the gas pressure in the chamber before the second gas control and the gas pressure in the chamber after the second gas control is smaller than a difference between the gas pressure in the chamber before the first gas control and the gas pressure in the chamber after the first gas control, and any one of the first gas control and the second gas control is executed in a period of performing laser oscillation, wherein the controller compares the gas pressure measured by the pressure sensor and a predetermined threshold value, the controller selects the first gas control when the gas pressure measured by the pressure sensor is lower than the predetermined threshold value, the controller selects the second gas control when the gas pressure measured by the pressure sensor is higher than the predetermined threshold value, and the controller is a gas controller; and a laser controller which performs adjusting oscillation at every time a total gas replacement of the chamber is executed, wherein the gas controller sets the predetermined threshold value based on the gas pressure in the chamber after the adjusting oscillation is performed.

2. The laser apparatus according to claim 1, wherein the controller increases the predetermined threshold value as the discharge electrodes deteriorate.

3. The laser apparatus according to claim 1, wherein the controller increases the predetermined threshold value at every time a total gas replacement of the chamber is executed.

4. The laser apparatus according to claim 1, wherein the controller performs the first gas control while laser gas exhaust by the exhausting device is stopped.

5. The laser apparatus according to claim 1, wherein the controller performs the second gas control such that an amount of gas supplied by the gas supply device and an amount of gas exhausted by the exhausting device are equal to each other.

* * * * *